United States Patent [19]

Scherpenberg et al.

[11] Patent Number: 5,315,549
[45] Date of Patent: May 24, 1994

[54] MEMORY CONTROLLER FOR NONVOLATILE RAM OPERATION, SYSTEMS AND METHODS

[75] Inventors: Francis A. Scherpenberg, Carrollton; Eric W. Mumper; John W. Rea, both of Dallas; Robert D. Lee, Denton, all of Tex.

[73] Assignee: Dallas Semiconductor Corporation, Dallas, Tex.

[21] Appl. No.: 714,545

[22] Filed: Jun. 11, 1991

[51] Int. Cl.⁵ .............................................. G11C 7/00
[52] U.S. Cl. .............................. 365/189.09; 365/229; 365/195
[58] Field of Search ............... 307/65, 66; 365/189.01, 365/189.09, 195, 229

[56] References Cited

U.S. PATENT DOCUMENTS

| | | | |
|---|---|---|---|
| 4,451,742 | 5/1984 | Aswell | 307/66 |
| 4,492,876 | 1/1985 | Colbert et al. | 365/229 X |
| 4,730,121 | 3/1988 | Lee et al. | 307/66 |
| 4,992,983 | 2/1991 | Suzuki | 365/195 X |
| 5,124,946 | 6/1992 | Takahashi | 365/195 |

Primary Examiner—James B. Mullins
Attorney, Agent, or Firm—Worsham, Forsythe, Sampels & Wooldridge

[57] ABSTRACT

A memory controller for supplying backup battery power when a main power supply voltage drops together with programmable plus power fail write protection. The controller includes supravoltage induced sleep mode operation, MOS switching between backup batteries during backup operation based on battery voltage levels and discharge circuitry for battery disposal.

13 Claims, 19 Drawing Sheets

MEMORY CONTROLLER FOR NONVOLATILE RAM OPERATION, SYSTEMS AND METHODS

BACKGROUND AND SUMMARY OF THE INVENTIONS

The present invention relates to electronic devices, and, more particularly, to semiconductor devices useful in connection with memories.

Typical semiconductor random access memories available for storage of information, as in a computer system, are volatile in the sense that an interruption of power will lead to a loss of contents. Both dynamic RAMs (DRAMs) and static RAMs (SRAMs) require a constant power supply, and various backup power supply arrangements have been proposed. For example, Dallas Semiconductor Corporation manufactures a CMOS SRAM which is combined with its own backup battery in a standard size package pinout to achieve a nonvolatile memory. Dallas Semiconductor Corporation also manufactures alternative battery backup devices such as the DS1210 memory controller which fits between a microprocessor and a standard SRAM and also connects to a backup battery. The DS1210 senses power supply voltage, which typically is a nominal 5 volts, and if this voltage drops below battery level voltage, typically a nominal 3 volts, the DS1210 switches the SRAM from the power supply to battery power. Also, the DS1210 may connect to two batteries and select the higher voltage battery for backup operation plus switch from the first backup battery to the second during backup operation if the voltage of the first battery drops much below that of the second battery.

Another aspect of a memory controller invokes write protection of the controlled memory as the voltage of the power supply falls. Such write protection helps avoid corruption of data in the memory.

A problem with the existing controllers is power consumption; all battery backup devices should draw as little current as possible during backup operation in order to prolong battery life.

Another problem with battery backup operation relates to the environmental concerns of disposal of used batteries. In particular, a 3 volt battery backing up a 5 volts power supply would typically be considered used up when its voltage drops to about 2 volts, and the battery at 2 volts presents an environmental hazard. Thus this would require an additional procedure of discharging the battery after removal from a circuit board and prior to disposal.

The present invention provides a memory controller for memories with programmable write protection for blocks of a controlled memory in addition to write protection upon falling power supply voltage, with low current draw switching between batteries during backup operation by use of MOSFET switches, with a supravoltage-activated sleep mode which isolates connected batteries to avoid leakage current discharge during storage, and with a battery discharge circuit to intentionally fully discharge batteries as may be required by environmental concerns.

BRIEF DESCRIPTION OF THE DRAWINGS

The present invention will be described with reference to the accompanying drawings, wherein.

DESCRIPTION OF THE PREFERRED EMBODIMENTS

Figure 1:
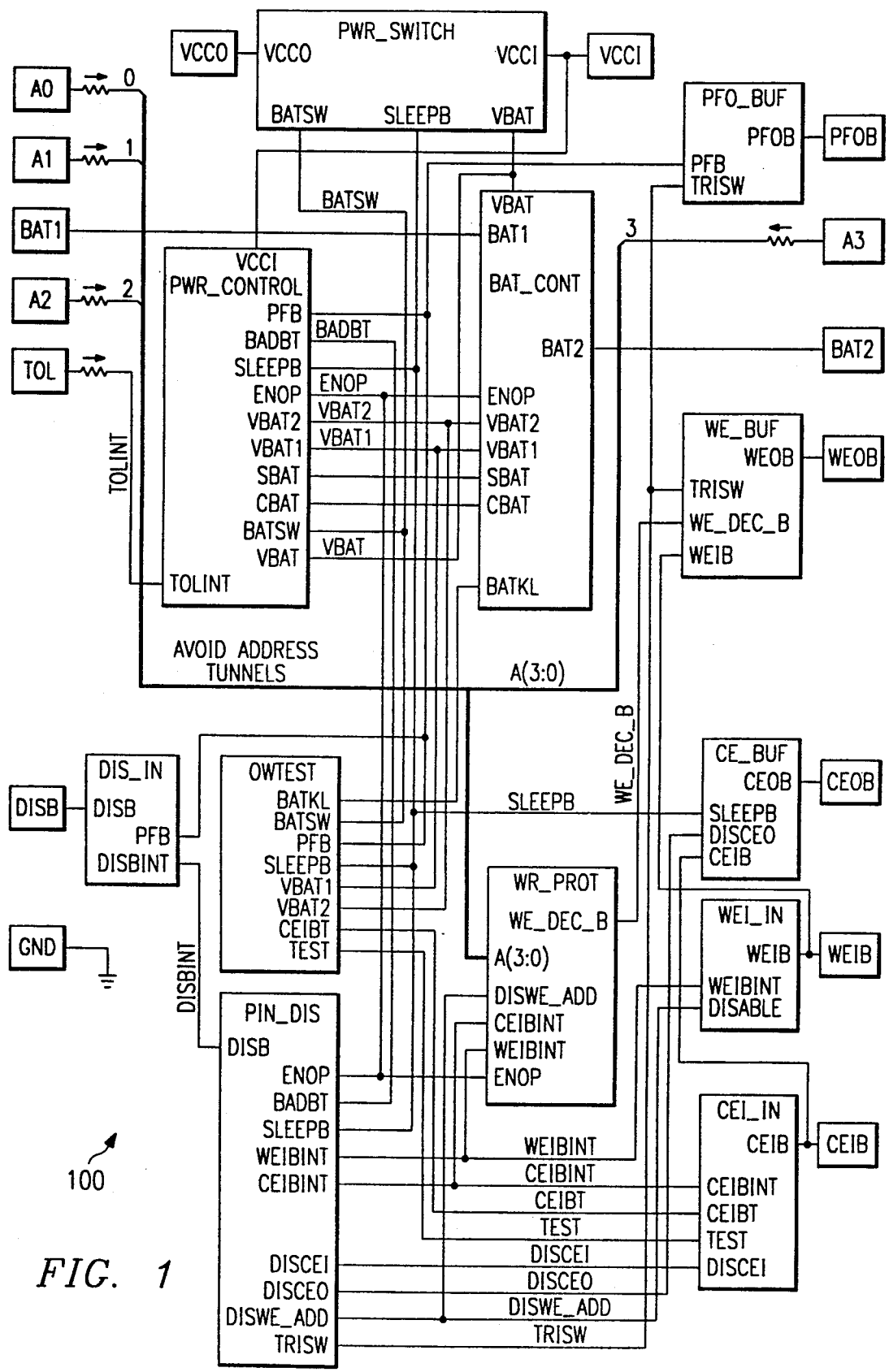
FIG. 1 is a functional/structural block circuit diagram of the first preferred embodiment battery manager.

FIG. 1 is a structural block circuit diagram of the first preferred embodiment of a nonvolatile controller, denoted generally with reference numeral 100, which includes the following blocks and functions. PWR_SWITCH is a switch to connect power output terminal VCCO to either power input terminal VCCI or battery power node VBAT which connects to battery power at input terminals BAT1 and BAT2. BAT_CONT compares the voltages at the battery terminals BAT1 or BAT2 and connects the higher voltage terminal to node VBAT. PWR_CONTROL compares the voltage at input power terminal VCCI to an internal reference voltage for power fail determination and also checks the voltages at battery power input terminals VBAT1 and VBAT2. WR_PROT contains write protection register and decoder for external RAM address partition as described below; this permits write protection of a block of external RAM. OWTEST contains an 8-bit shift register that can be used for 1-wire serial inputs for testing purposes when controller 100 is in a sleep mode. PIN_DIS contains circuitry for disable signals; and DIS_IN, PFO_BUF, WE_BUF, CE_BUF, WEI_IN, and CEI_IN are various buffers. The terminals include VCCI for input power supply, BAT1 and BAT2 for input battery power, VCCO for output power to a controlled RAM, GND for ground, WEIB and CEIB for write and chip enable inputs typically from a microprocessor, WEOB and CEOB for write and chip enable outputs to the controlled RAM, TOL for selection of power supply tolerance, A0-A3 for controlled RAM write protection block selection, DISB for disabling write protection, and PFOB for output of the power fail signal indicating the input power supply at terminal VCCI has a voltage out of tolerance. These terminals may be connected to the pins of a packaged integrated circuit version of controller 100; or the terminals may be connected to items such as batteries within a package.

Figure 2:
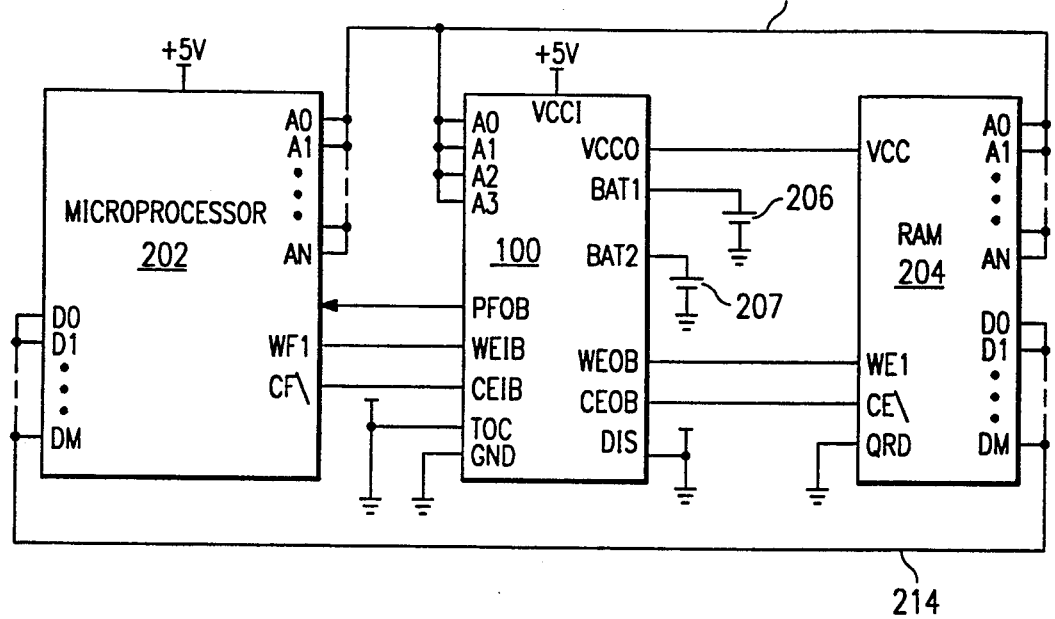
FIG. 2 shows an application of the first preferred embodiment.

FIG. 2 illustrates controller 100 connected to microprocessor 202 and RAM 204 plus batteries 206-207. RAM 204 may be a standard CMOS static RAM (SRAM); such memories lose their contents if the voltage of the power supplied at input VCC falls below about 2 volts. Controller 100 supplies the power to RAM 204 input VCC and includes backup power from the batteries 206-207 if the main 5 volt power supply feeding input VCCI fails. RAM 204 provides data and program storage for microprocessor 202 with microprocessor 202 putting N-bit memory addresses A0A1 . . . AN on address bus 212 and sending and receiving M-bit data D0D1 . . . DM on data bus 214. Controller 100 taps the four highest address bits, A0A1A2A3, from address bus 212 to use in its write protection feature. Further, controller 100 detects the level of the 5 volt power supply and issues a power fail signal to microprocessor 202 plus stops further writes and reads of RAM 204 if the level drops by about 5% or 10%.

Controller 100 has two modes of operation: in the first mode it functions like the Dallas Semiconductor Corp. DS1210 nonvolatile controller, and in the second mode it adds write protection for the controlled RAM. When the disable pin (DISB) is grounded, controller 100 enters the DS1210 mode. An internal pulldown resistor to ground on the DSIB pin of the controller 100 allows it to retrofit into DS1210 applications. When the DISB pin is grounded, the address inputs A0–A3 and the write enable input WEIB are ignored. Also, the power fail output PFOB and the write enable output WEOB are tristated; and the controlled RAM has its WE\ input directly connected to the WE\ output of the microcontroller. When the disable pin DISB is connected to VCCO, controller 100 enters the second mode of operation which write protects portions of the controlled RAM by controlling the WE\ input of the controlled RAM as described below. Essentially, the address inputs A0–A3 provide write protection blocks and the WEOB output is connected to the WE\ input of the controlled RAM to implement the write protection.

In both the DS1210 mode and the write protection mode of operation, controller 100 performs five circuit functions required to battery backup a RAM. For the first function, a switch is provided to direct power from the battery or the incoming power supply (VCCI), depending on which is greater, to the output power terminal VCCO. This switch has a voltage drop of less than 0.2 volts.

The second function provided by the controller 100 is power fail detection. The incoming supply (VCCI) is constantly monitored. When the supply goes out of tolerance, a precision comparator detects power failure an inhibits both the chip enable output (CEOB) and the write enable output (WEOB); of course, the WEOB output is only significant in the write protection mode of operation.

A third function of write prevention is accomplished by holding both the chip enable output CEOB and write enable output WEOB (for the write protection mode) to within 0.2 volts of VCCO when VCCI is out of tolerance. If CEIB is low at the time that power fail detection occurs, the CEOB signal is kept low until CEIB is brought high again. However, CEOB is forced high after 1.5 microseconds regardless of the state of CEIB. Similarly, for the write protection mode if WEIB is low at the time that power fail detection occurs, the WEOB is signal will remain low until WEIB is brought high or 1.5 microseconds elapse. The delay of write prevention until the current memory cycle is complete prevents corrupted data. Power fail detection occurs in the range of 4.75 to 4.5 volts with the tolerance pin TOL grounded. If the tolerance pin is connected to VCCO, then power fail detection occurs in the range of 4.5 volts to 4.25 volts. The PFOB signal is driven low and remains low until VCCI returns to nominal conditions. During nominal supply conditions, CEOB will follow CEIB and, with controller 100 in the write protection mode of operation and for a nonprotected address, WEOB will follow a WEIB high-to-low transition with a maximum propagation delay of 20 ns and a low-to-high transition with a delay of 5 ns.

The fourth function which the controller 100 performs is a battery status warning so that potential data loss is avoided. Each time VCCI is applied to the device, battery status is checked with a precision comparator. If, during battery backup, no switch occurred from one battery to the other, the voltage of the battery supplying power when VCCI is applied is checked. If this voltage is less than 2 V, the second chip enable cycle after power is supplied is inhibited. If any switch from one battery to another did occur, the voltage of both batteries is checked. If either voltage is less than 2 V, the second chip enable cycle will be inhibited. Battery status can therefore be determined by performing a read cycle after power up to any location in memory, verifying that memory location's contents. A subsequent write cycle can them be executed to the same memory location altering the data. If the next read cycle fails to verify the written data, then the data is in danger of being corrupted.

The fifth function of the controller 100 provides for battery redundancy. When data integrity is extremely important, it is wise to use two batteries to insure reliability. The controller 100 provides an internal isolation switch which allows the connection of two batteries. When entering battery backup operation, the battery with the highest voltage is selected for use. If one battery should fail, the other would then supply energy to the connected load. The switch to a redundant battery is transparent to circuit operation and to the user. In applications where battery redundancy is not a major concern, a single battery should be connected to the BAT1 pin. The BAT2 battery pin must be grounded. When batteries are first connected to one or both of the VBAT pins, VCCO will not show the battery potential until VCCI is applied and removed for the first time.

When the disable pin is connected to VCCI or VCCO, the controller 100 performs all of the functions described above and with addition of a partition switch which selectively write protects blocks of memory (the write protection mode). The state of the DISB pin is strobed and latched as VCCI crosses the power fail trip point so that the controller 100 maintains its configuration during power loss. If the strobed value of DISB is a high, the internal pulldown resistor on the DISB pin will be disconnected in the power fail state to eliminate the possibility of battery discharge. The register controlling the partition switch is selected by recognition of a specific binary pattern which is sent on address lines A0–A3. These address lines are normally the four upper order address lines being sent to RAM. The pattern is sent by twenty consecutive read cycles with the exact pattern as shown in Table 1.

TABLE 1

| | PATTERN MATCH TO WRITE PARTITION REGISTER | | | | | | | | | | | | | | | | | | | | | | | |
|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| $A_0$ | 1 | 0 | 1 | 1 | 1 | 1 | 0 | 0 | 1 | 1 | 1 | 0 | 0 | 0 | 0 | 0 | 1 | 1 | 0 | 1 | X | X | X | X |
| $A_1$ | 1 | 1 | 1 | 1 | 1 | 0 | 0 | 1 | 1 | 1 | 0 | 0 | 1 | 0 | 1 | 1 | 0 | 0 | 0 | 0 | X | X | X | X |
| $A_2$ | 1 | 1 | 1 | 1 | 0 | 0 | 1 | 1 | 1 | 0 | 0 | 1 | 0 | 1 | 0 | 1 | 0 | 0 | 0 | 1 | X | X | X | X |
| $A_3$ | 1 | 1 | 0 | 0 | 0 | 1 | 1 | 1 | 0 | 0 | 1 | 0 | 0 | 0 | 1 | 0 | 1 | 0 | 0 | 0 | X | X | X | X |

Pattern matching must be accomplished using read cycles; any write cycles will reset the pattern matching circuitry. If the pattern is matched perfectly, then the 21st through 24th read cycle will load the partition switch. Since there are sixteen possible write protected partitions, the size of each partition is determined by the size of the memory. For example, a 128K×8 memory would be divided into sixteen partitions of (128K×8)/16, or 8K×8. Each partition is represented by one of the sixteen bits contained in the 21st through 24th read cycle as defined by A3 through A0 and shown in Table 2.

TABLE 2

PARTITION REGISTER MAPPING

| Address Pin | Bit number in pattern match sequence | Partition Number | Address State Affected ($A_3A_2A_1A_0$) |
|---|---|---|---|
| $A_0$ | BIT 21 | PARTITION 0 | 0000 |
| $A_1$ | BIT 21 | PARTITION 1 | 0001 |
| $A_2$ | BIT 21 | PARTITION 2 | 0010 |
| $A_3$ | BIT 21 | PARTITION 3 | 0011 |
| $A_0$ | BIT 22 | PARTITION 4 | 0100 |
| $A_1$ | BIT 22 | PARTITION 5 | 0101 |
| $A_2$ | BIT 22 | PARTITION 6 | 0110 |
| $A_3$ | BIT 22 | PARTITION 7 | 0111 |
| $A_0$ | BIT 23 | PARTITION 8 | 1000 |
| $A_1$ | BIT 23 | PARTITION 9 | 1001 |
| $A_2$ | BIT 23 | PARTITION 10 | 1010 |
| $A_3$ | BIT 23 | PARTITION 11 | 1011 |
| $A_0$ | BIT 24 | PARTITION 12 | 1100 |
| $A_1$ | BIT 24 | PARTITION 13 | 1101 |
| $A_2$ | BIT 24 | PARTITION 14 | 1110 |
| $A_3$ | BIT 24 | PARTITION 15 | 1111 |

A logical 1 in a bit location sets that partition to write protect. A logical 0 in a bit location disables write protection. For example, if, during the pattern match sequence, bit 22 on address pin A1 were a 1, this would cause the partition register location for partition 5 to be set to a 1. This in turn would cause the controller 100 to inhibit WEOB from going low as WEIB goes low whenever A0A1A2A3=0101. Note that, while setting the partition register, data which is being accessed from the RAM should be ignored, as the purpose of the sixteen read cycles is to set the partition switch and not for the purpose of accessing data from RAM. Also note that, on initial battery attach, the partition register can power up in any state.

Figure 3:
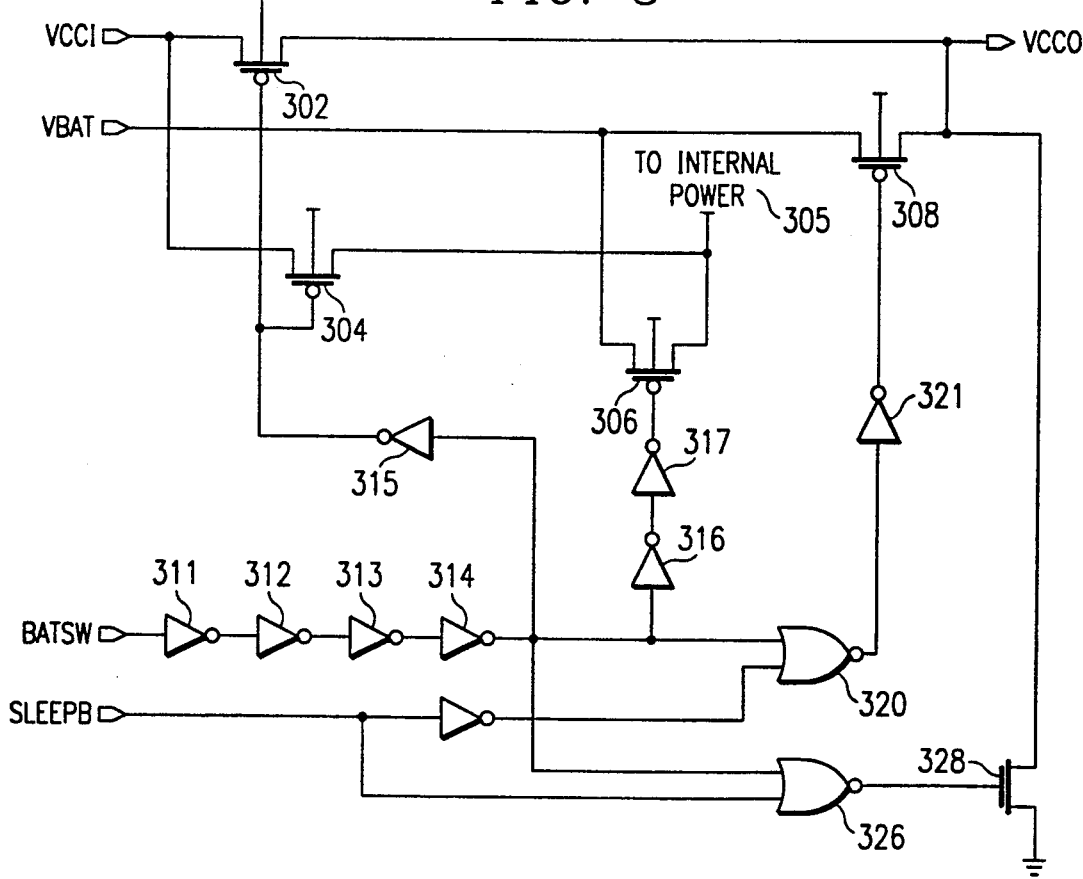
FIGS. 3-10, 11a-11c and 12-14 are schematic block and circuit diagrams of the embodiment of FIG. 1.

FIG. 3 is a schematic circuit diagram of block PWR_SWITCH of FIG. 1 and illustrates the switch between inputs VCCI and VBAT to connect to output VCCO and operates as follows. First, block PWR_CONTROL (see discussion in connection with FIG. 5) feeds a high signal to node BATSW if the voltage at terminal VCCI is higher than each of the voltages at terminals BAT1 and BAT2, and feeds a low signal if not. Thus with a high on node BATSW inverters 311-315 provide a low to the gates of p-channel FETs 302 and 304 which turns them on. FET 302 has an extremely large gate width-to-length ratio (about 50,000) and connects node VCCI to node VCCO. With node VCCI connected to terminal VCCI of FIG. 1 and the external power supply, nominally at 5 volts for standard CMOS parts, this provides a nominal 5 volts of output power at node VCCO and output terminal VCCO of FIG. 1. FET 304 being turned on connects node VCCI to the internal power supply node 305 to provide power for operation of controller 100. BATSW high also drives NOR gate 320 low and thus inverter 321 high and p-channel FET 308 off to isolate node VBAT from node VCCO. Now if the signal at node BATSW is low (implying that the voltage at power input terminal VCCI is lower that the voltage of at least one of the batteries at battery input terminals BAT1-BAT2), then inverters 311-315 turn off FETs 302 and 304, but inverters 316-317 turn on p-channel FET 306. FET 306 connects the internal power supply source node 305 to node VBAT and through block BAT_CONT to one of the terminals BAT1 and BAT2 of FIG. 1 which normally connect to batteries nominally at 3 volts each. Lastly, block PWR_CONTROL feeds a high signal to node SLEEPB to put controller 100 in an active state, and a low signal to put controller 100 to sleep. A high at node SLEEPB provides a low input to NOR gate 320, so the low at node BATSW then yields a high output for NOR gate 320 and turns on p-channel FET 308. This connects node VBAT to power output node VCCO and thus provides output battery power. Contrarily, if SLEEPB is low (sleep mode), then NOR gate is driven low and turns off FET 308 to isolate output node VCCO. Further, BATSW low and SLEEPB low drives NOR gate 326 high to turn on n-channel FET 328 to pull node VCCO down to ground. In summary, PWR_SWITCH gives the following:

BATSW=1 and SLEEPB=1: VCCO=VCCI and Node 305=VCCI

BATSW=1 and SLEEPB=0: VCCO=VCCI and Node 305=VCCI

BATSW=0 and SLEEPB=1: VCCO=VBAT and Node 305=VBAT

BATSW=0 and SLEEPB=0: VCCO=ground and Node 305=VBAT where BATSW=1 means VCCI>VBAT and SLEEPB=0 means sleep mode as described in the following.

Figure 4:
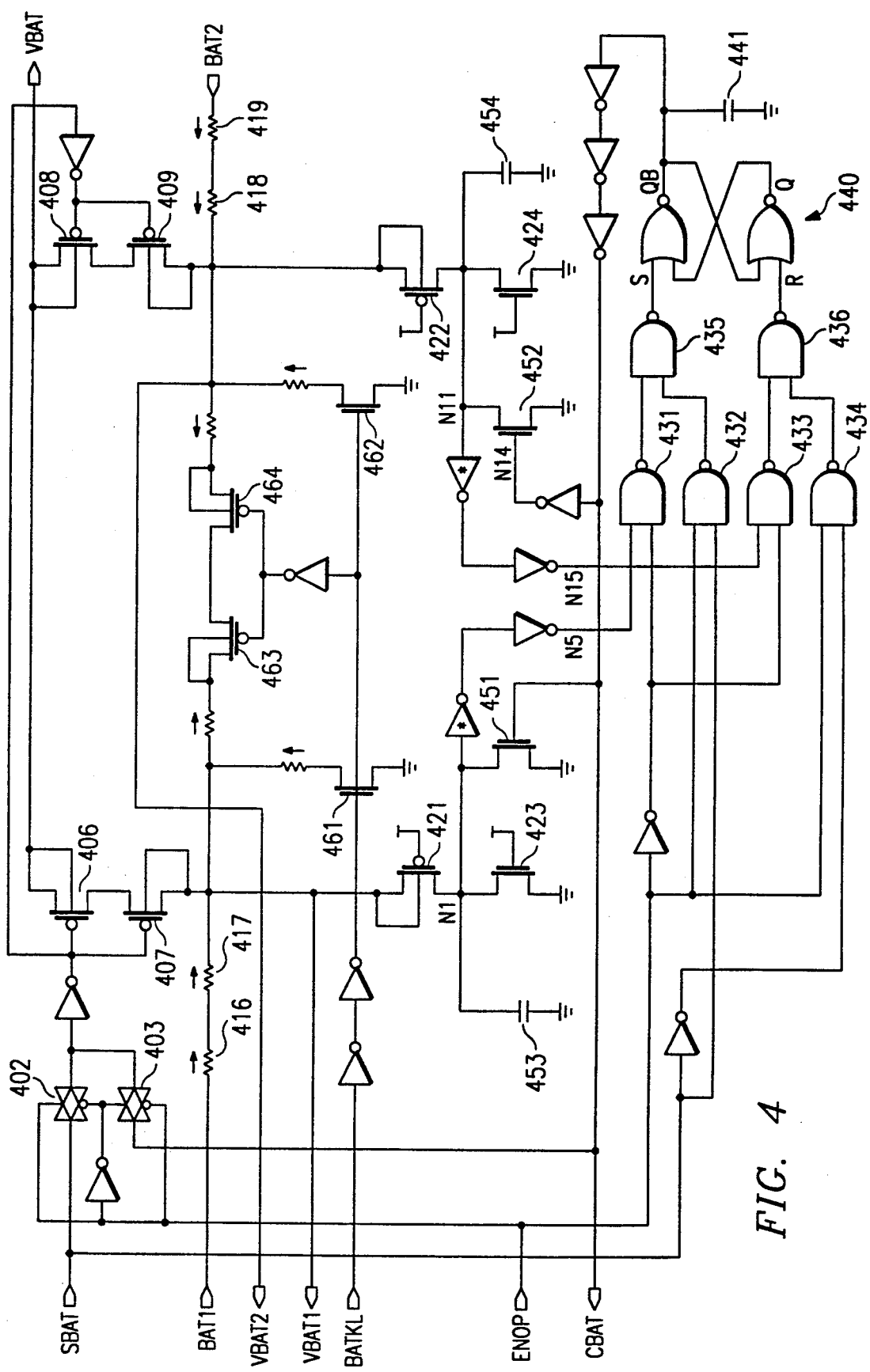

FIG. 4 shows block BAT_CONT with input nodes BAT1 and BAT2 for input of external battery power, SBAT to select the external battery with higher voltage during good power conditions, BATKL for a battery grounding signal, and ENOP for an enable operation signal. BAT_CONT also has output nodes VBAT for output battery power, VBAT1 and VBAT2 for direct connections (with ESD protection) to the two external batteries, and CBAT for current battery indication during power fail conditions. BAT_CONT operates as follows.

First, consider normal operation when VCCI is near 5 volts and the two batteries connected to terminals and nodes BAT1 and BAT2 are each near 3 volts. Also, presume ENOP is high which just reflects the lack of a power failure (described in connection with FIG. 5) and that BATKL is low which means the batteries are not being shorted to ground. ENOP high makes transmission gate 402 conducting and transmission gate 403 nonconducting so that the signal at SBAT passes through transmission gate 402 to turn on p-channel FETs 406-407 and turn off p-channel FETs 408-409 if SBAT is high. This connects BAT1 through ESD protection resistors 416-417 to output VBAT and isolates BAT2 from VBAT. Conversely, if SBAT were low, then FETs 406-407 would be off and FETs 408-409 would be on to connect BAT2 through ESD protection resistors 418-419 to VBAT and isolate BAT1. As discussed in connection with FIG. 5, if the voltage of the battery at BAT1 is higher than that of the battery at BAT2, then SBAT is high; and conversely, if BAT2 has the higher voltage, then SBAT is low. Hence, the higher voltage battery is connected to VBAT.

As noted in connection with FIG. 3, VCCI near 5 volts implies an internal power supply (node 305 source) of about 5 volts, thus p-channel FETs 421 and 422 both have an applied gate voltage of about 5 volts but a source voltage of only about 3 volts and are turned off. FETs 421-422 will become active when VCCI drops and the internal power supply switches to battery power. With FETs 421-422 both off, nodes N1 and N11 are both grounded through turned-on high impedance n-channel FETs 423-424. These lows are each inverted twice and fed to NAND gates 431 and 433 to drive them high. ENOP high feeds NAND gates 432 and 434 along with SBAT and the inversion of SBAT, respectively. Thus the output of NAND 432 is low if SBAT is high and high if SBAT is low; conversely, the output of NAND gate 433 is high if SBAT is high and low if SBAT is low. The outputs of NAND gates 431-434 drive NAND gates 435 and 436 to Set and Reset inputs of NOR gate latch 440:SBAT high sets latch 440 to Q=1 (and QB=0) and SBAT low resets latch to Q=0. The QB output is filtered by capacitor 441 (which also causes latch 440 to power up into the Q=1 state) and inverted three times to output node CBAT; thus CBAT=SBAT in this case (ENOP=1 and VCCI at about 5 volts). Hence, CBAT indicates which of the batteries has a higher voltage: CBAT=1 implies SBAT=1 which derives from the battery at BAT1 being of higher voltage.

If the voltage VCCI drops out of tolerance (e.g., to 4.5 volts), then ENOP switches low (discussed in connection with FIGS. 5-6) and this drives NAND gates 432 and 434 both high so that the inputs of latch 440 are now both low and latch 440 remains in its current state and CBAT does not switch. The switch of ENOP low also switches transmission gate 402 to nonconducting and transmission gate 403 to conducting so that CBAT then drives the gates of FETs 406-407 and 408-409 and the node BAT1-BAT2 previously connected to VBAT remains connected to VBAT during the VCCI out of tolerance (power fail) condition. The use of latch 440 prevents spurious pulses generated during power fail from driving node SBAT and switching batteries connected to VBAT.

As VCCI falls further out of tolerance and to below the voltage at VBAT (e.g., to below 3 volts), then the higher voltage battery (BAT1 or BAT2) will provide power through VBAT for both output VCCO and the internal power supply sourced at node 305. But as the higher battery drains down during this battery backup power supply condition, its voltage may drop below that of the originally lower voltage battery and block BAT_CONT generates a switch of batteries as follows. Presume BAT1 is the originally higher voltage battery at a voltage of 3.0 volts and that the battery at BAT2 has a voltage of 2.9 volts. Thus latch 440 is in the Q=1 state and CBAT=1 which implies n-channel FET 451 is on and n-channel FET 452 is off. Then when VCCI drops below 3 volts (presume VCCI totally fails to 0 volts) the battery at BAT1 begins supplying all of the power requirements and the internal power supply is at 3.0 volts and is applied to the gates of FETs 421 and 422. The source voltage on FET 421 is 3.0 (BAT1) and the source voltage on FET 422 is 2.9 volts (BAT2), so both FETs are off due to a threshold voltage of about −0.7 volt. Now as the battery at BAT1 supplies power its voltage will gradually decrease. When the voltage at BAT1 falls to about 2.2 volts the gate to source voltage of FET 421 will still be 0 but the gate to source voltage of FET 422 will have decreased to about −0.7 volts and FET 422 will turn on. FETs 421 and 422 both have a large gate width-to-length ratio, so FET 422 turns on abruptly. This permits the battery at BAT2 to quickly charge up capacitor 454 and pull node N11 high (2.2 volts). Node N11 going high switches NAND gate 433 low (because the other input is an inversion of ENOP which has gone low), and this drives NAND gate 436 high to reset latch 440 to the Q=0 state and CBAT to low. CBAT low turns off FETs 406-407 and turns on FETs 408-409 to switch VBAT from BAT1 to BAT2. This also implies the internal power supply increases from the voltage of BAT1 (about 2.2 volts) to the voltage of BAT2 (about 2.9 volts) and the gate to source voltage of FET 422 jumps to 0 and FET 422 turns off. Of course, the gate to source voltage of FET 421 has been zero and jumps to 0.7 volt, so FET 421 stays off during this switching of batteries. Note that CBAT low also turns on FET 452 to discharge capacitor 454 and bring node N11 back to ground. Node N11 returning low switches NAND gate 433 high and thus NAND gate 436 low so the inputs to latch 440 are both low and ready for any further switching although latch 440 remains in the Q=0 state and holds CBAT low.

Note that capacitors 453 and 454 prevent nodes N1 and N11 from pulling up when batteries are initially attached to nodes BAT1 and BAT2. Also, the subthreshold currents of p-channel FETs 421 and 422 are small compared to base currents from comparable current handling bipolar transistors, so the use of FETs to trigger the switch between BAT1 and BAT2 will consume less power than comparable bipolar switches during battery backup operation as the voltage of the originally-higher battery slowly decreases below the voltage of the other battery. If current is being drawn from the unused battery by the bipolar transistor, then it will also discharge and defeat the purpose of switching batteries by a weakening of the higher voltage battery.

The case of BAT2 originally at a higher voltage than BAT1 is symmetrical:FET 421 turns on as BAT2 drops below BAT1, latch 440 switches from Q=0 to Q=1 to change from CBAT=0 to CBAT=1, and then FET 421 turns off.

Node BATKL connects to the gates of n-channel FETs 461-462 and p-channel FETs 463-464, so that a high at BATKL will connect batteries at BAT1 and BAT2 together and short both to ground. This option permits discharge of batteries prior to disposal and meets the Environmental Protection Agency (EPA) requirements for disposal of lithium batteries. Of course, controller will be powered by VCCI during this battery discharge.

Figure 5A:
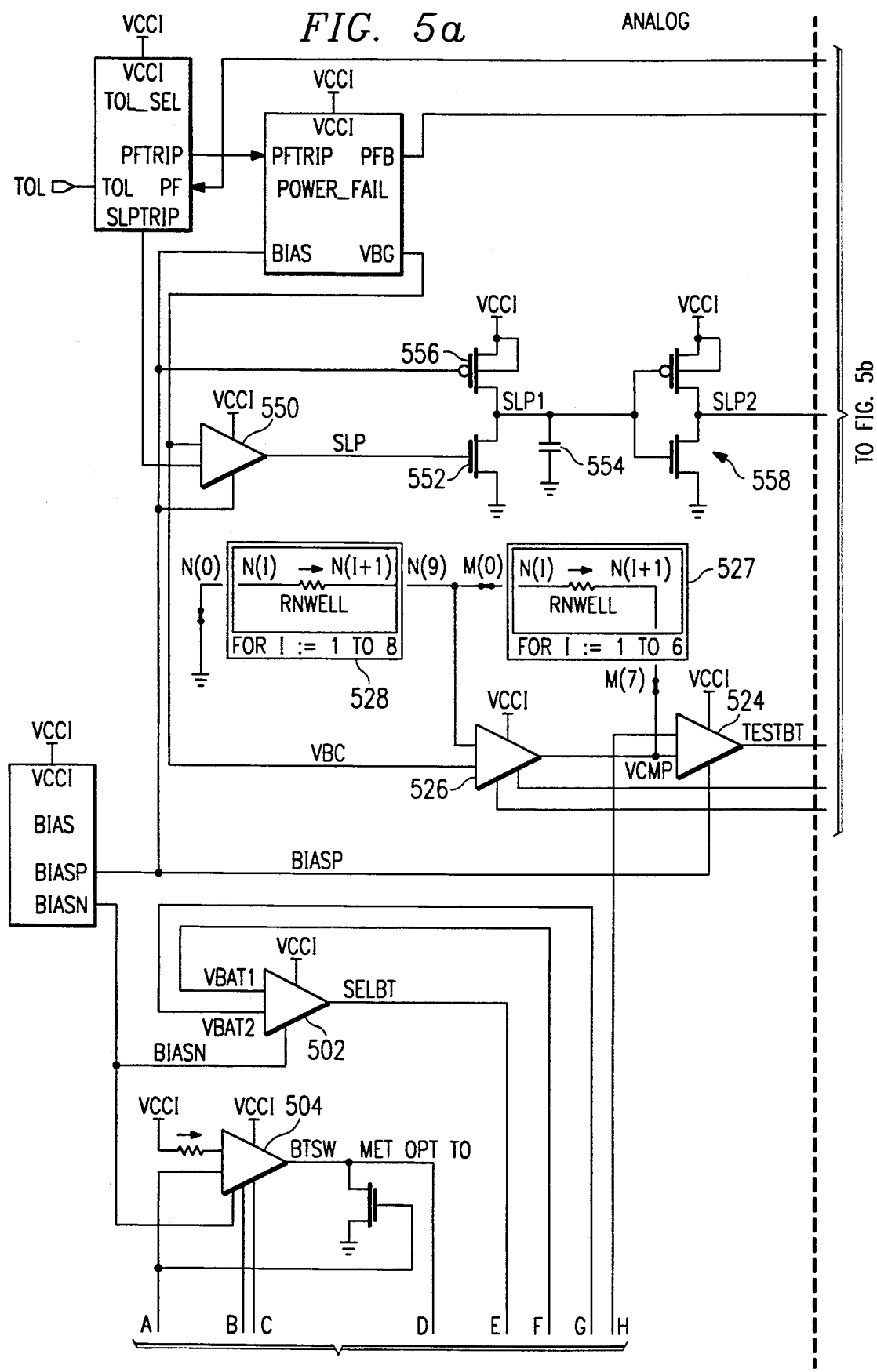
Figure 5B:
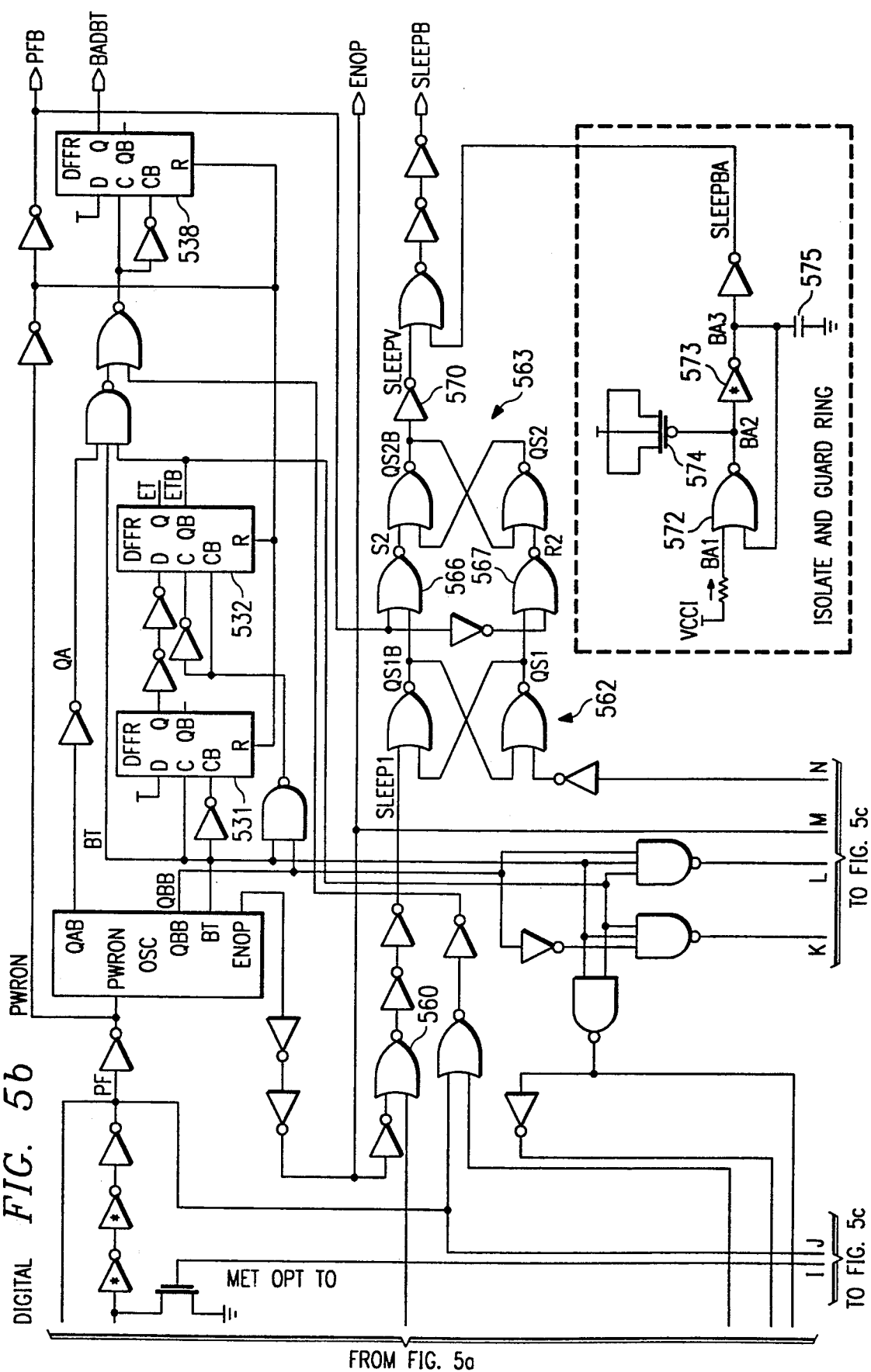
Figure 5C:
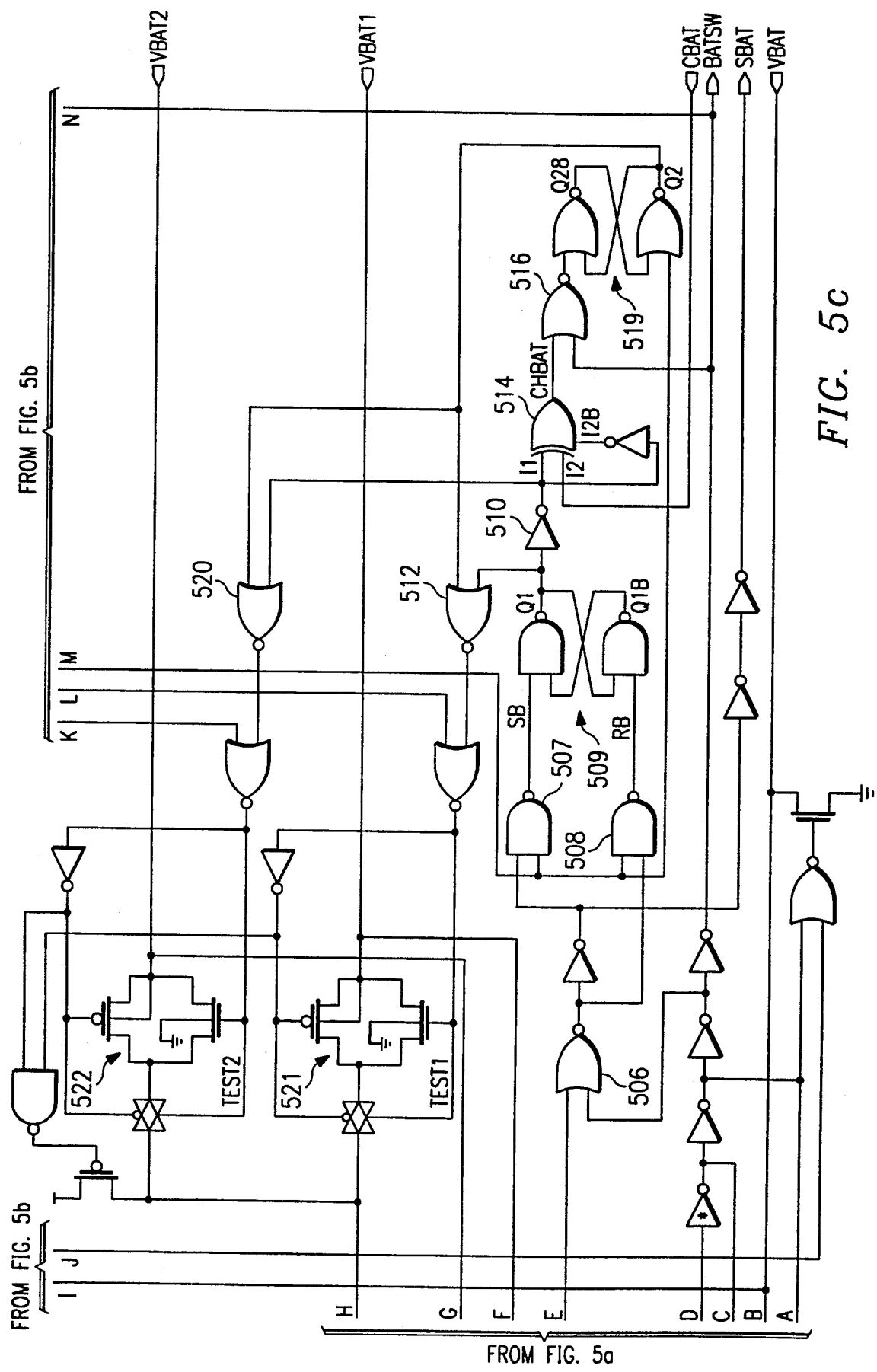

FIG. 5 shows block PWR_CONTROL including analog circuitry in the lefthand portion and digital circuitry in the righthand portion. The digital portion includes oscillator subblock OSC (FIG. 6) and the analog portion includes subblocks TOL_SEL (FIG. 7), POWER_FAIL (FIG. 8), and BIAS (FIG. 9). As described in the following, OSC generates a delay for ENOP going high after PFB has gone high (e.g., power up or external power is restored after power fail), TOL_SEL basically provides a resistive voltage divider to select a fraction of the voltage at VCCI (PFTRIP) to compare to an internal bandgap voltage reference in POWER_FAIL to determine the power fail condition, and BIAS is just a resistive FET bias voltage reference to set current sources. Discussion of the operation of PWR_CONTROL follows consideration of these subblocks.

Figure 6:
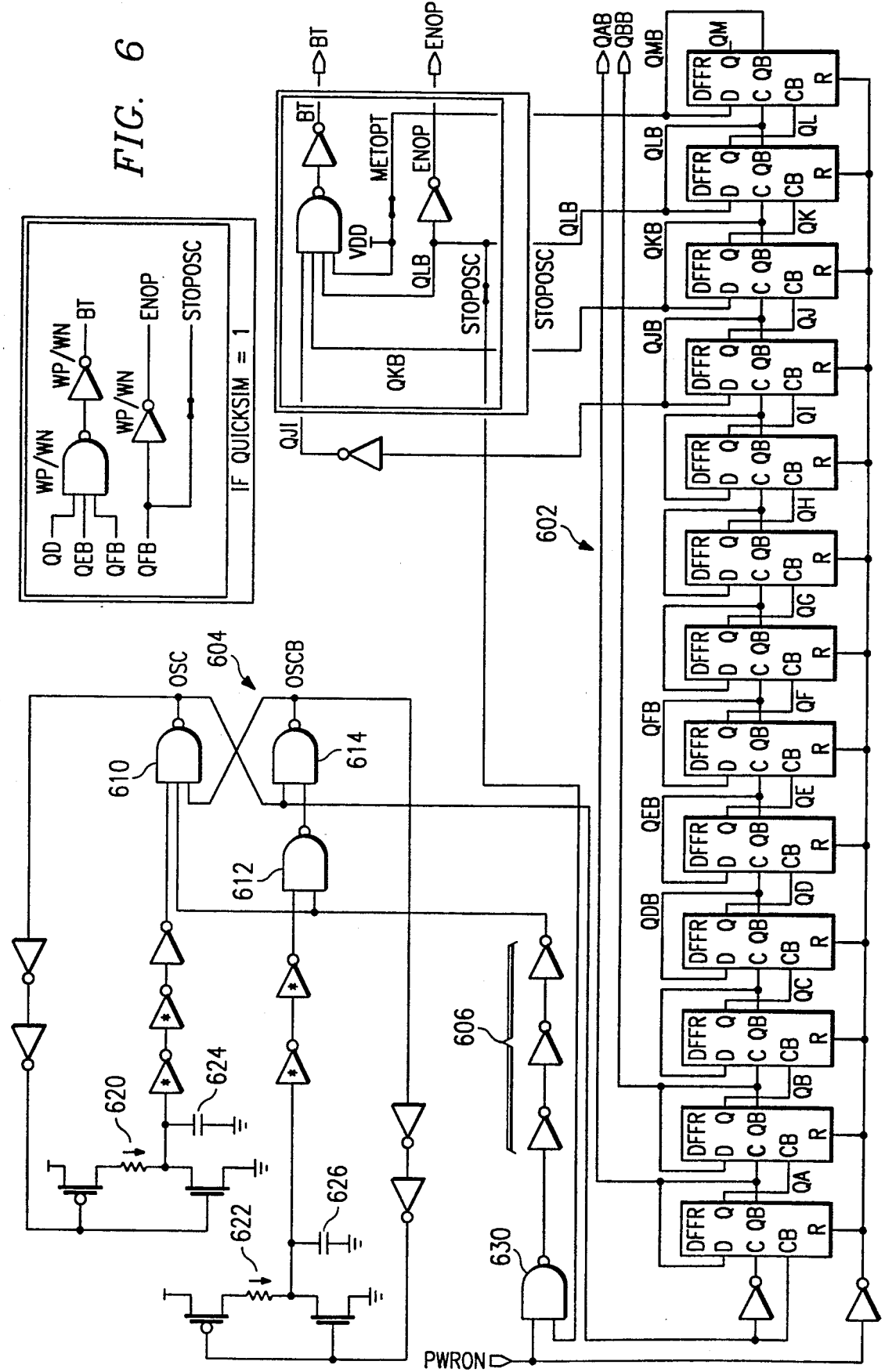

FIG. 6 is a schematic diagram of block OSC and includes counter 602 comprising thirteen flip-flops and oscillator 604 which has two feedback loops with each loop having an inverter including a resistor in series with the pull up p-channel FET and a capacitor tied to the output; the resistor and capacitor provide an RC time delay. Oscillator 604 and counter 602 generate a 70 microsecond (usec) delay for ENOP to go high after PFB has gone high as follows. Presume PFB has been low (VCCI power fail condition described below) and then at time t0 PFB goes high (VCCI returns to in tolerance). Prior to time tH (four inverter delays after t0) node PWRON has been low which provides both a high at reset terminal R for each flip-flop, holding the flip-flop in the Q=0 state (output at terminal Q low and at terminal QB high) and also a low (inversion by inverters 606 of the high of NAND gate 630) input for NAND gates 610 and 612. This low input sets NAND gates 610 and 612 both high, which then sets NAND gate 614 low and inverter 620 low (so capacitor 624 is discharged) and inverter 622 high (so capacitor 626 is charged up). Then when node PWRON switches to high, the flip-flops are released from their reset and the low inputs to NAND gates 610 and 612 switch high. Thus NAND gate 612 switches low and then NAND gates 610 and 614 both switch, and this switching is propagated to inverters 620 and 622. Inverter 622 quickly switches low by discharging capacitor 626 through its n-channel FET and thereby propagates the switching to NAND gate 614 where it stops until NAND gate 610 switches. Contrarily, inverter 620 does not output a high until capacitor 624 is charged up by current through its p-channel FET and resistor, this takes about 17 usec. Once inverter 620 outputs a high, this propagates to switch NAND gate 610 and thereby permit the switching propagation of the other feedback loop to pass NAND gate 614 and propagate a low to inverter 622 which (analgous to inverter 620) takes about 17 usec to output a high. Thus oscillator 604 has a period of about 34 usec, and this is used as the clock inputs to the first flip-flop of counter 602. The clock inputs for each other flip-flop of counter 602 comes from the output of the preceeding flip-flop, so the twelfth flip-flop does not switch from Q=0 to Q=1 for about 70 msec ($2^{11} \times 43$ usec). The QB output of the twelfth flip-flop appears, after inversion, at node ENOP, so about 70 msec after tH the voltage at node PWRON switches from low to high. The QB output of the twelfth flip-flop also feeds back to NAND gate 630 to stop the oscillations. During this delay in PWRON going high the batteries are tested depending on what happened during battery backup as decoded by latches 509 and 519 and described in connection with FIG. 5 below. Note that the outputs QAB, QBB, and BT are used for timing of these battery tests.

Figure 7:
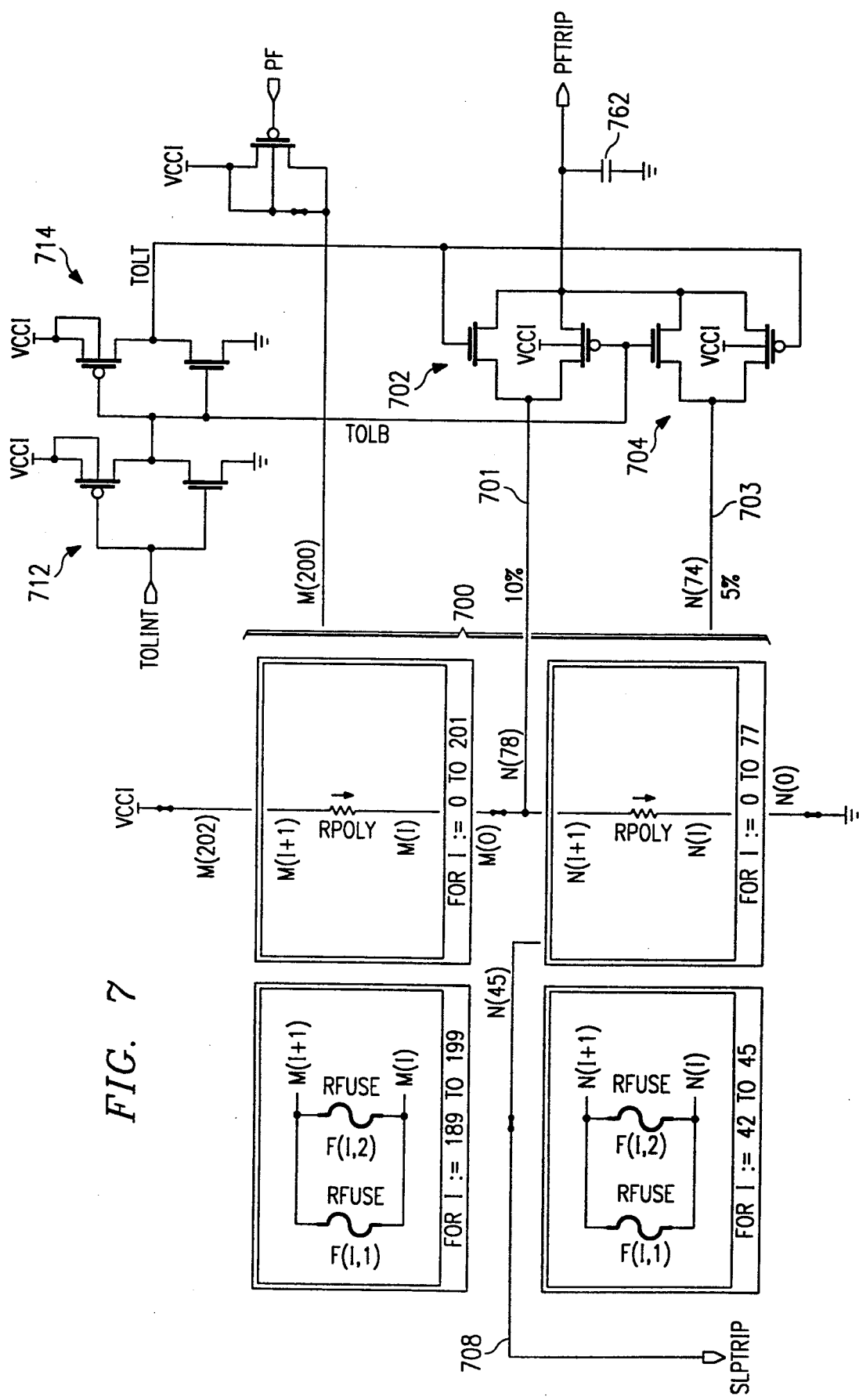

FIG. 7 illustrates resistive voltage divider 700 connected between VCCI and ground and which is made of polysilicon. Tap 701 on divider 700 at 74/263 of VCCI connects through transmission gate 702 to filter capacitor 762 and node PFTRIP (Power Fail TRIP), and tap 703 on divider 700 at 70/263 of VCCI connects through transmission gate 704 to capacitor 762 and node PFTRIP. Transmission gates 702 and 704 are complementarily switched by inverters 712 and 714 which, in turn, are driven by the signal at node TOL. If the voltage at TOL is high, then inverter 712 is low, inverter 714 is high, transmission gate 702 is conducting, transmission gate 704 nonconducting, and tap 701 connects to node PFTRIP. Contrarily, if TOL is low, then tap 703 connects to node PFTRIP.

Consider the case of TOL high. When VCCI is 5 volts, 74/263 VCCI is 1.40 volts and the inputs to comparator 840 are a net +170 mV, and the output of comparator 840 (PFB) is high (5 volts). Now if VCCI drops to 4.45 volts, then 74/263 VCCI drops to 1.24 volts, whereas the bandgap reference output at node 808 is 1.23 volts. Thus the net input to comparator 840 is +10 mV, and the output of comparator 840 remains high (5 volts). However, if VCCI drops to 4.38 volts, then 74/263 VCCI equals 1.23 volts and just matches the output of the bandgap reference at node 808. In this case the net input to comparator is 0, and the output drops to roughly 2 volts and is very sensitive to input fluctuations. And when VCCI drops to 4.35 volts, then 74/263 VCCI is 1.22 volts and the net input to comparator 840 is −10 mV and the output PFB falls low (to about 0 volt) to indicate a power fail condition.

The case of TOL low is analogous, and tap 703 at 70/263 of VCCI leads to a corresponding trip point of 4.66 volts in VCCI to make PFB go low.

FIG. 7 also shows tap 708 at 42/263 of VCCI which connects to node SLPTRIP. The voltage at SLPTRIP is compared to the bandgap voltage reference (1.23 volts) of subblock POWER_FAIL to decide upon sleep mode operation. When VCCI is 5 volts, 42/263 of VCCI is 0.79 volts, but when VCCI increases to 7.76 volts, then SLPTRIP increases to 1.23 volts to trigger a sleep mode as described below in connection with FIG. 5.

Figure 8:
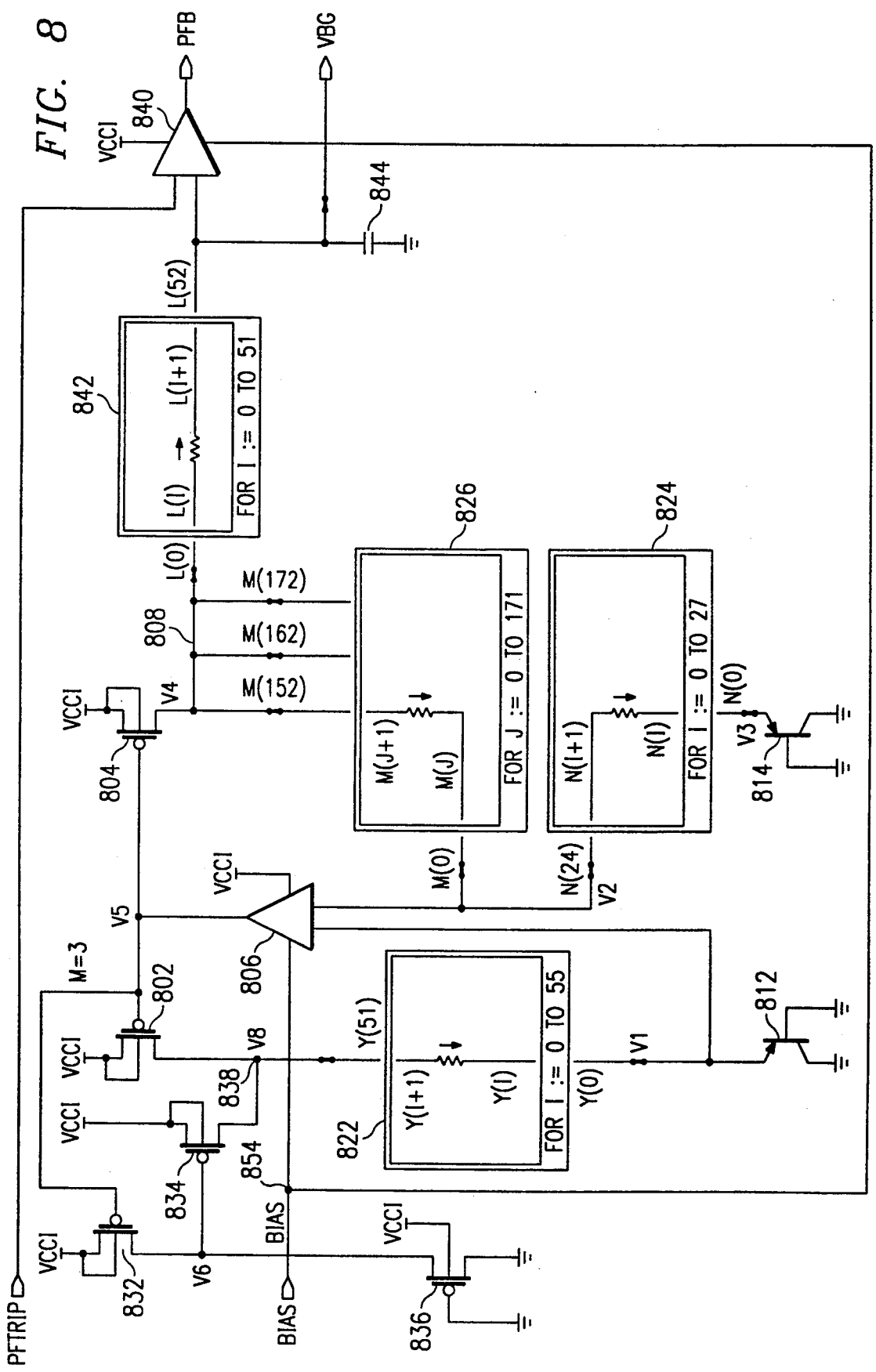
Figure 9:
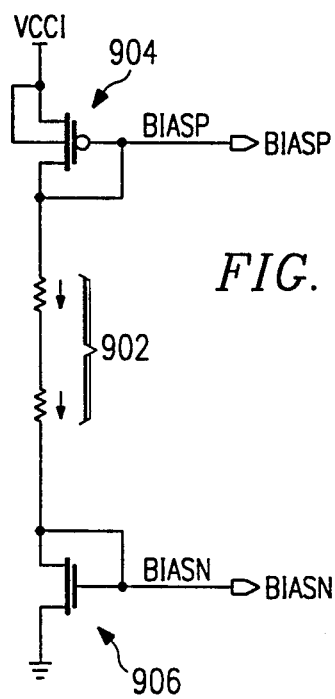

FIG. 8 shows the POWER_FAIL block which includes a bandgap reference circuit made of p-channel FETs 802 and 804, operational amplifier (opamp) 806, pnp substrate bipolar transistors 812 and 814 connected as diodes, resistors 822, 824, and 826, and p-channel FETs 832, 834, and 836. Comparator 840 compares the output of the bandgap reference to the power source (VCCI) voltage at terminal PFTRIP. The bandgap reference output is filtered by resistor 842 and capacitor 844 and output at node VBG. Node BIAS provides a bias (from subblock BIAS) for both opamp 806 and comparator 840. Note that bandgap references in general are not low power devices, but the present bandgap reference does achieve low power consumption due to particular design features.

The bandgap reference basically operates in the standard fashion: FETs 802 and 804 are current sources that provide currents to the bipolar transistors 812 and 814 to generate the differential emitter-base voltage drop ($\Delta V_{EB}$) across resistor 824, and opamp 806 provides feedback to set the current level. Resistor 826 multiplies $\Delta V_{EB}$ to have the bandgap reference voltage at node 808 temperature independent. Note that a power supply voltage drop does not affect the emitter-base characteristics and that opamp 806 will compensate for a drop by increasing the gate drive of FETs 802 and 804; a lower power supply voltage appears as a smaller $V_{SD}$ in FETs 802 and 804.

In more detail, FETs 802 and 804 have the same gate lengths (19 um) but the width of FET 802 (27 um) is three times the width of FET 804 (9 um). The gates of FETs 802 and 804 are tied together, and thus the current through FET 802 is three times the current through FET 804. During operation with a power supply voltage of about 5 volts the current through FET 804 will be about 5 uA with a source-to-gate bias of about 2 volts, and $V_{SD}$ will be about 3.9 volts. Thus the power draw of both current paths with a 5 volts power supply totals about 100 uW. Bipolar transistor 814 has 9 times the emitter area of bipolar transistor 812, and so the emitter-base voltage drop of 812 is equal to the emitter-base voltage drop of 814 plus $\Delta V_{EB}$ where $\Delta V_{EB}$ equals $(kT/q)\ln(27)$. The factor of 27 arises from the ratio of the current through 212 to the current through 814 multiplied by the ratio of the emitter area of 814 to the emitter area of 812 (i.e., $3\times9$). Thus $\Delta V_{EB}$ is roughly equal to 86 mV, and this voltage appears across resistor 824 because the inputs of opamp 806 are at virtually the same voltage. Resistor 826 has 6.333 times the resistance of resistor 824, and thus the reference voltage output node 808 is equal to the emitter-base voltage drop of bipolar 814 plus $(kT/q)\ln(27)(1+6.333)$. The positive temperature coefficient of $(kT/q)\ln(27)(7.333)$, which is the voltage drop across resistors 824 plus 826, and just cancels the negative temperature coefficient of the emitter-base voltage drop of bipolar 814 to render the reference voltage at node 808 temperature independent to first order.

Note that if the current through FETs 802 and 804 is too large, then the IR drop across resistor 824 is greater than $\Delta V_{EB}$ and the net input to opamp 806 is positive which is amplified and drives the gates of FETs 802 and 804 more positive and thereby lessens the currents. Conversely, if the current is too small, then opamp 806 decreases the gate voltages of FETs 802 and 804 and thereby increases the currents. And this feedback control by opamp 806 does not depend upon the internal power supply voltage $V_{dd}$ provided that $V_{dd}$ is large enough to keep opamp 806 active (about 2.5 volts, which is less than battery voltage until the batteries are near discharge).

Resistor 826 has about three times the resistance of resistor 822, but conducts only one third of the current. Thus resistor 822 provides a voltage drop equal to the voltage drop in resistor 826 and this equalizes the $V_{SD}$ of FETs 802 and 804. Without resistor 826 the bandgap reference would have another source of error. In particular, $V_{SD}$ of FET 802 normally is larger than that of FET 804 (4.2 volts versus 3.8 volts) and changes with temperature whereas that of FET 804 does not. This implies channel length modulation for FET 804 and introduces a source of error in the ratio of the currents through FETs 802 and 804. Indeed, if the temperature increases, then the emitter-base drop of both bipolars decreases and opamp 806 decreases the gate voltages of FETs 802 and 804 to increase the current to compensate by increasing the IR drop in resistors 824 and 826 and increasing the emitter-base drop to keep node 808 at 1.23 volts. However, there is no corresponding IR drop between FET 802 and bipolar 812, so $V_{SD}$ of FET 802 increases and this shortens the effective channel length and increases the current more than just the increase due to the gate voltage adjustment by opamp 806. Hence, rather than having three times the current of FET 804, FET 802 has more than three times the current, and this change in ratio changes logarithm factor in $\Delta V_{EB}$ and thus changes the reference output at node 808.

FETs 832, 834, and 836 provide a startup circuit for the bandgap reference. In particular, on power up it is possible that the positive input to opamp 806 would be 0.1 volt higher than the negative input since the inputs are floating and only connected to ground through junctions in bipolars 812 and 814; and such a differential input to opamp 806 would keep current source FETs 802 and 804 turned off and yield a stable state at zero current through both bipolars 812 and 814. However, if the gates of FETs 802 and 804 are biased to turn off, then FET 832 is also off and FETs 836 and 834 are turned on. This pulls up node 838 and thus the negative input of opamp 806 which, in turn, causes opamp 806 to drive down the bias on the gates of FETs 802 and 804 to turn them on. Opamp 806 simultaneously turns on FET 832 which turns off FET 834 and isolates the start up circuit from the remainder of the bandgap reference. During operation of the bandgap reference, the power drawn by the start up circuit is only about 5 uW because FET 836 has a gate width to length ratio of 1/150 and presents a resistance of 5 megohms when connected as a diode drawing 1 uA of current. The use of FET 836 rather than a 5 megohm resistor saves area on the integrated circuit substrate.

The reference voltage at node 808 is fed to the negative input of comparator 840 through the low pass filter made of resistor 842 and capacitor 844. Resistor 842 has a resistance of about 120 Kohms, and capacitor 844 has a capacitance of about 110 pF. The reference voltage at node 808 is equal to about 1.23 volts and does not vary with the power supply voltage provided there is sufficient voltage to operate opamp 806 and current sources 802 and 804 (about 2.5 volts). Variations in the power supply voltage are compensated for by variations in $V_{GS}$ of the current sources 802 and 804.

FIG. 9 shows subblock BIAS comprising resistor 902 and diode-connected p-channel FET 904 and n-channel FET 906 in series between VCCI and ground. The FET gate voltages are tapped as node BIASP for biasing p-channel FET current sources and node BIASN for biasing n-channel FET current sources. Resistor 902 is made of both polysilicon and n-well substrate to yield a resistance that compensates for the temperature dependence of $V_{GS}$. Note that subblock BIAS is powered by VCCI, so during battery backup operation BIAS does not draw power from the batteries.

Returning to FIG. 5, PWR_CONTROL operates as follows. First consider normal operating conditions of external power input terminal VCCI at 5 volts and 3 volt batteries at each of terminals BAT1 and BAT2, plus presume for example the voltage at BAT1 is slightly higher than that of BAT2. The inputs TOL, VBAT1, VBAT2, CBAT, and VBAT have been previously described: VBAT1 and VBAT2 are both at about 3 volts, CBAT is high (due to BAT1 slightly higher than BAT2), VBAT connects to BAT1, and TOL may be either high or low to set the power fail trip point. Comparator 502 compares the voltages at inputs VBAT1 and VBAT2 and outputs a high because VBAT1 is higher than VBAT2 (but would output a low if VBAT2 were the higher). Comparator 504 compares VBAT with VCCI and outputs a high because VCCI is higher VBAT. The output of comparator 504 is inverted four times (no change) and output at node BATSW; thus BATSW is high and provides VCCI powered operation as discussed in connection with FIG. 3. The high from comparator 502 and the low (inverted high) from comparator 504 feed NOR gate 506 to output a low. This low is inverted three times to output a high at node SBAT which selects BAT1 to connect to VBAT as discussed in connection with FIG. 4. The low output of NOR gate 506 also feeds NAND gates 507 (inverted) and 508 to control NAND gate latch 509. The other inputs to NAND gates 507 and 508 derive from output ENOP of subblock OSC described in connection with FIG. 8, and ENOP is high during normal operation. Hence, NAND gate 507 is low, NAND gate 508 is high, and latch 509 is in the Q=1 state to output a high to inverter 510 and NOR gate 512. (Note that if BAT2 had the higher voltage, then the output of comparator 502 would be low and NOR gate 506 high and latch 509 in the Q=0 state to indicate such). The low output of inverter 510 and the high at node CBAT feed exclusive OR gate 514 to output a high to NOR gate 516. The other input of NOR gate 516 is the high from comparator 504 (BATSW), so NOR gate 516 outputs a low to the set input of NOR gate latch 519. The reset input to latch 519 is ENOP, so latch 519 is in the Q=0 state and outputs a low to NOR gate 512.

Latches 509 and 519 store information about which batteries are used during battery backup operation, and this information determines which batteries are tested after external power VCCI returns (PFB goes high) but before ENOP returns high. Comparator 524 performs the battery tests by comparing the voltage at nodes VBAT1 and VBAT2 to the output of opamp 526 which outputs a voltage of about 2.2 volts. Opamp 526 generates the 2.2 volts by a feedback of resistors 527 and 528 connected to its positive input and the 1.23 volt bandgap voltage reference connected to its negative input; the ratio of the resistance of resistor 527 to that of resistor 528 is 7 to 9, so the feedback is 9/16 of the output and the output is 16/9 of the bandgap voltage reference. The timing of the battery tests comes from flip-flops 531 and 532 clocked by subblock OSC. VBAT1 and VBAT2 connect to comparator 524 through transmission gate pairs 521 and 522 which are controlled by the outputs of latches 509 and 519 driving NOR gates 512 and 520 and by the timing from OSC and flip-flops 531-532. The battery first used during backup is always tested and if a battery switch occurred both batteries are tested. Latch 509 stores the first battery used while the XOR fed by CBAT on latch 519 tests for a changed battery and sets to a Q=1 if a change occurs. The flip-flops 531-532 after the oscillator decode when to test each battery during startup. OSC output QBB is a multiple of two of QAB so during a cycle of QBB the test is started and the result is latched on the following QAB cycle to allow comparator setup time. If a battery tests at below 2.2 volts, then the low output of comparator 524 leads to a clocking of flip-flop 528 to a high which appears at node BADBT to indicate a bad battery.

Comparator 550 triggers sleep mode by comparing the bandgap voltage reference (1.23 volts) VBG of POWER_FAIL to the voltage at node SLPTRIP from TOL_SEL: if SLPTRIP is higher than VBG, then comparator 550 outputs a low to turn off n-channel FET 552 and charge up capacitor 554 through p-channel FET 556. Note that FET 556 is biased by node BIASP from subblock BIAS, so FET 556 is a current source and limits the charging rate of capacitor 554. Recall from the discussion in connection with FIG. 7 that SLPTRIP is higher than VBG only if VCCI is higher than 7.76 volts, so the sleep mode is induced by setting VCCI above the normal operating voltage of 5 volts. The charging of capacitor 554 up to the threshold of inverter 558 takes about 300 microseconds, and if during this time VCCI falls below 7.76 volts, then comparator 550 switches high to turn on FET 552 to rapidly discharge capacitor 554. This prevents short spikes in VCCI from inadvertently triggering sleep mode. The charging of capacitor 554 to threshold switches inverter 558 low and this signal is conditioned by ENOP at NOR gate 560 since this signal should be stable and not prone to bouncing during startup. The output of NOR gate 560 feeds a double latch setup 562-563. Latch 562 is reset only when BATSW=0 (which implies VCCI has dropped to below battery voltage) and latch 563 is Set and Reset with PFB as an enable signal through NOR gates 566-567. This combination allows PFB to BATSW hysteresis in setting sleep mode so any glitches or rattling do not keep the controller 100 from entering sleep mode since PFB also resets sleep mode. In particular, with VCCI at 7.76 volts or more BATSW will be high, so the high from NOR gate 560 makes latch output a low to NOR gate 566 and a high to NOR gate 567. But PFB is also high at this time, so the NOR gates 566 and 567 will both output low, and latch 563 continues in the same state as prior to VCCI going to 7.76 volts. However, when VCCI falls (e.g., external power is disconnected) to trigger a power fail signal, PFB=0, NOR gate 566 goes high to force latch 563 to a state outputting a low to inverter 570 and thus a low at node SLEEPB indicating a sleep mode for controller 100. Also, BATSW and ENOP both go low (although delayed from PFB), so latch 562 is reset to output a high to NOR gate 566 and a low to NOR gate 567. Thus the inputs to latch 563 become both low, and latch 563 will switch when PFB goes high and return SLEEPB high.

While in sleep mode (SLEEPB=0) controller 100 has VCCO isolated from both VCCI (which is presumably low enough to have PFB=0) and VBAT, so no power is supplied, and disable signals DISCEI, DISCEO, DISWE_ADD, and TRISW (FIG. 13) are all high. In FIG. 1, DISCEI high into buffer CEI_IN forces CEIBINT high; DISABLE (DISWE_ADD) high into buffer WEI_IN drives WEIBINT high; DISCEO high and SLEEPB low into buffer CE_BUF isolates CEOB; TRISW high and WE_DEC_B low (due to CEIBINT and/or WEIBINT high: see FIG. 12) into buffer WE_BUF isolates WEOB; and DISWE_ADD high will stop addresses A0-A3 at WE_PROT_SET (see FIG. 11a). Thus sleep mode limits activity in controller 100 and conserves battery power.

Feedback loop made of NOR gate 572 and inverter 573 provides a sleep mode for battery attachment. When a battery is first attached with VCCI low, inverter 573 is latched low by capacitor 574 capacitively pulling up the input to inverter 573 and capacitor 575 and VCCI providing two low inputs to NOR gate 572. And inverter 573 low drives output node SLEEPB low to enter sleep mode. Contrarily, when VCCI rises above the trip point of NOR gate 572, then inverter 573 latches high and sleep mode is determined by latch 563.

When the voltage of VCCI falls from 5 volts PWR_CONTROL operates as follows. First, as VCCI drops below the tolerance level (e.g., 4.5 volts), TOL_SEL's analog output of PFTRIP falls below the bandgap voltage reference and POWER_FAIL switches its PFB digital output and (after six inverters) node PFB from high to low plus drops the PWRON input to OSC from high to low. PWRON low resets counter 602 and thereby switches ENOP from high to low. ENOP low holds NOR gate 560 low and will squelch bouncing of the sleep signal from inverter 558 when VCCI later rises, and PFB low holds the reset input of sleep latch 563 low so if the latch is set to have controller 100 enter sleep mode, then it cannot emerge from sleep mode until VCCI returns to above tolerance level. Also, as discussed in connection with FIG. 4, ENOP going low switches transmission gates 402-403 so that CBAT rather than SBAT decides which battery connects to VBAT, plus connects the inputs of latch 440 to nodes N1 and N11 which are both stay low until a switch in batteries during battery backup power operation occurs (recall the operation of FET 422). ENOP low also drives both inputs of latch 509 high so it retains the state indicating which battery has higher voltage and is connected to VBAT; plus ENOP low releases latch 519 so that it may switch to indicate a switch in batteries during battery backup operation. Recall latches 509 and 519 store information about battery use so for battery testing after VCCI returns to above tolerance.

As VCCI continues to fall and drops below the higher battery voltage (VBAT), comparator 504 switches BATSW from high to low and battery powered operation begins as previously described in connection with FIG. 4. This may be regular operation or may be sleep mode, depending upon the setting of latch 563, and may involve the switching from one battery to the other and even switching back as the batteries are drained. Now BATSW going low also releases the low on NOR gate 516 so that latch 519 will be switched if CBAT switches as will occur when batteries are switched during battery operation; recall discussion in connection with FET 422 in FIG. 4. This then provides the information for whether one of both of the batteries should be tested when VCCI returns to above tolerance. Comparator 504 must have a common mode voltage higher than the power supply because it compares VCCI with VBAT which are the two possible power supply voltages. Comparator 504 also has hysteresis to allow for the possibility of VBAT rising after a switch from battery power back to VCCI due to the removal of the IR drop.

VCCI returning to above VBAT makes comparator 504 switch BATSW back high and power is again supplied by VCCI and not the batteries. Then when VCCI further increases to above tolerance, PFB and PWRON return high which starts OSC oscillating and counting as described in connection with FIG. 6. After one oscillation period OSC drives QAB low and after two periods QBB low, these signals are timing for the battery tests described above that use the stored states of latches 509 and 519 to decide which battery(ies) to test. After the battery tests, ENOP returns high and normal operation resumes.

Figure 10:
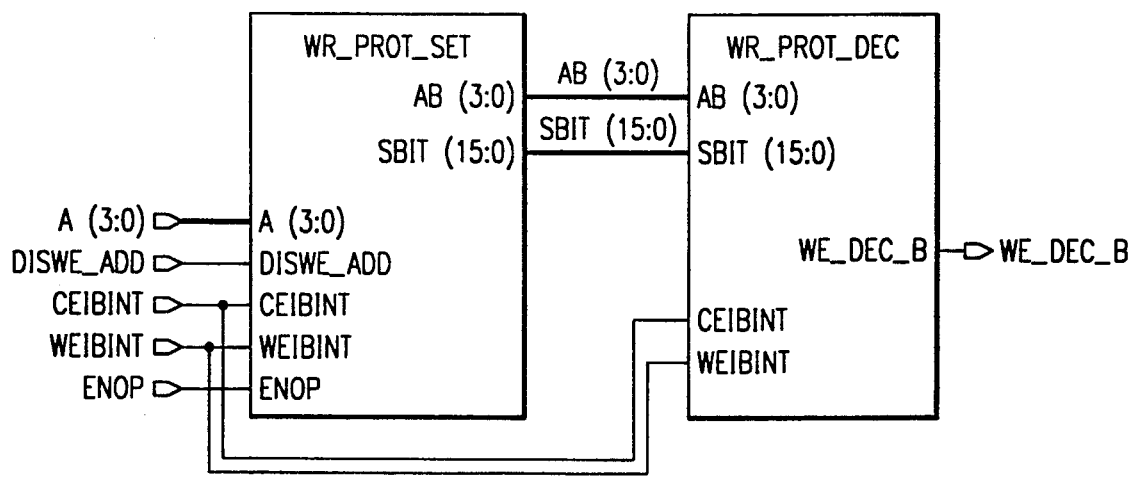

Controller 100 provides programmable write protection for blocks of RAM 204 by checking write addresses against stored protect/nonprotect information and for protected addresses preventing the write enable WEB signal from passing to RAM 204. FIG. 10 shows block WR_PROT as composed of subblocks WR_PROT_SET and WR_PROT_DEC which function to set the write protection portions of external RAM 204 (see FIG. 2) and to decode addresses to check for write protection, respectively.

Figure 11:
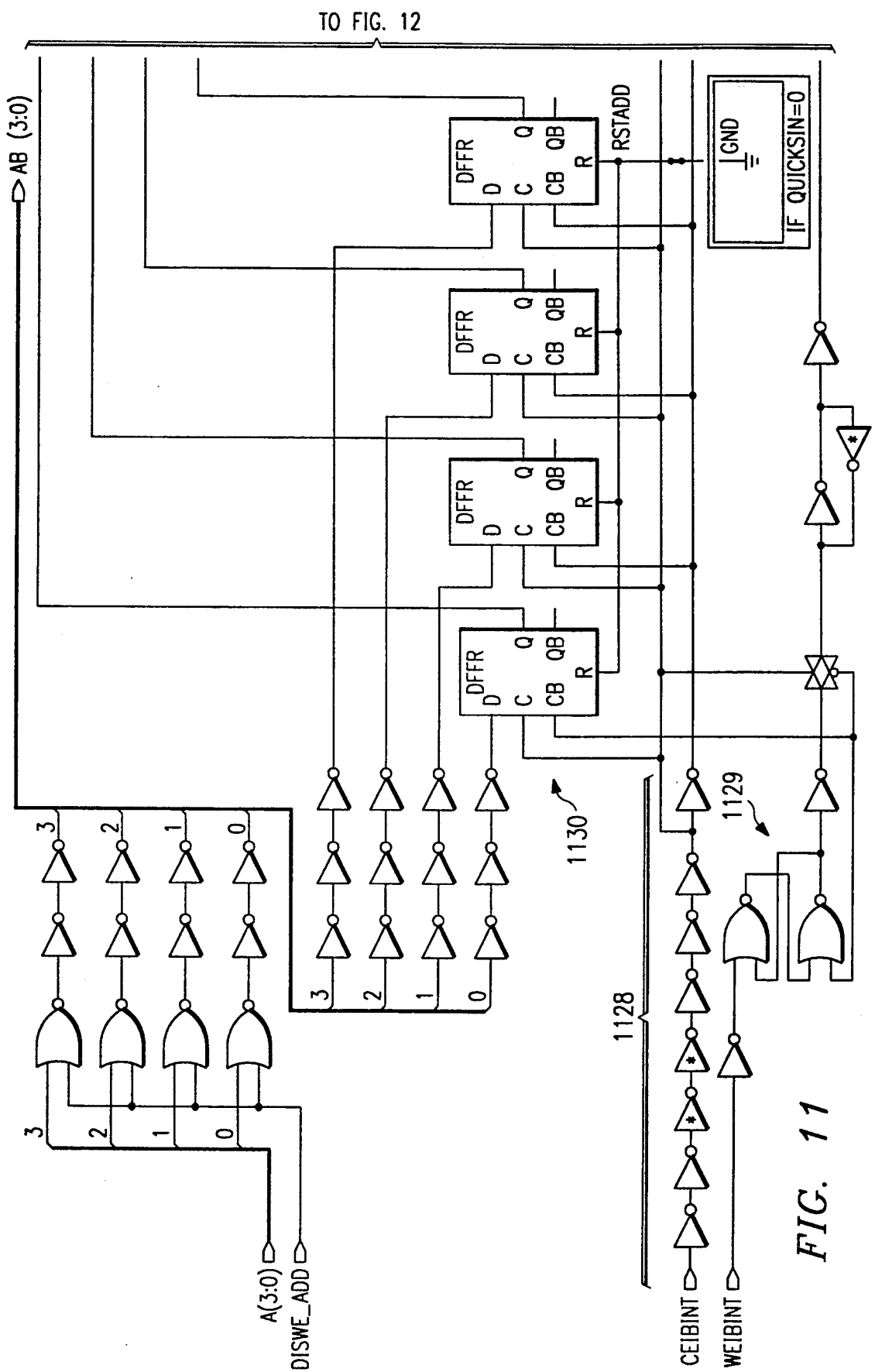

FIGS. 11a-c together from a schematic circuit diagram for subblock WR_PROT_SET which includes 4-bit address latch 1130, counter 1132 made of five flip-flops, five two-inverter feedback loops 1133 to hold the output of counter 1132, five transmission gates 1134 isolating the output of counter 1132 from the feedback loops 1133 during the clocking of counter 1132, 24-read cycle decoder 1110, 16-bit partition register 1136, 16-bit output bus SBIT(15:0), . . . WR_PROT_SET operates as follows. Microprocessor 202 sends chip enable signals in connection with read cycles to input terminal CEIB which are passed to node CEIBINT and (after several gate delays to allow for address set-up time) to clock counter 1132, transmission gates 1134, and address latch 1130. The output of counter 1132 is decoded in both 24-read cycle decoder 1100 and in partition register 1136. In decoder 1100 each of the 24 NOR gates 1101-1124 corresponds to one of the 24 entries of Table 1. For example, the entry number 3 of Table 1 has a bit pattern 1110 and occurs in the third read cycle; the bit pattern 1110 for addresses A0-A3 implies that A0T=1, A1T=1, A2T=1, and A3B=1 where the suffix T means true and the suffix B means complement (bar). These are precisely the connections to NAND gate 1170. Further, at the third cycle the output of counter 1132 is C0T=1, C1T=1, C2B=1, C3B=1, and C4B=1, and C0T connects to NAND gate 1170 and the others connect to NAND gate 1172. Thus the two inputs to NOR gate 1103 are both low only if during the third read cycle the address bits are as shown in the Table 1 entry. Now the two low inputs to NOR gate 1103 implies a high output which drives NOR gate 1174 low, and this makes NAND gate 1176 high, which forces NOR gate 1178 low. NOR gate 1178 low implies latch 1180 does not switch as line CK is clocked by CEIBINT and thus CRSTB remains low. This occurs for the 24 NOR gates 1101-1124 during the 24 read cycles of Table 1.

If an entry is missed, that is, the pattern of Table 1 does not occur, then none of the NOR gates 1101-1124 goes high during that read cycle, and NOR gate 1178 goes high to switch latch 1180 and drive CRSTB low. CRSTB low drives NAND gate 1181 high to reset all of the flip-flops of counter 1132 except the first one. Now a read address with bits A0-A3 all 1's (first entry of Table 1) implies NAND gate 1190 goes low and if NAND gate 1181 is high, then the first flip-flop is set to the Q=1 state, but if the bits A0-A3 are not all 1's, then the first flip-flop is reset to the Q=0 state. In this manner counter 1132 continually resets until the first entry of Table 1 occurs and then it begins counting as long as successive entries of Table 1 are being read. A write command from microprocessor 202 will lead to a low pulse on node WEIBINT and this will switch latch 1129 to also reset counter 1132.

If all of the entries of Table 1 occur and counter 1132 does count up 20, then NAND gates 1182-1185 decode counts 21-24, respectively, and during each of the corresponding cycles the address bits A0-A3 are read into four cells of partition register 1136. Partition register 1136 (FIG. 11c) includes cells numbered 0 to 15 with each cell having a feedback loop of two inverters (1141 and 1142 illustrated in cell 3), a transmission gate (1145 for cell 3) between the cell and a corresponding one of the address lines A0-A3 (A3T for cell 3) with the decoded count controlling the transmission gates, and each cell connected to one of the output bits of 16-bit bus SBIT(15:0). Thus the cells of partition register 1136 are only available after counter 1132 has counted past 20.

Figure 12:
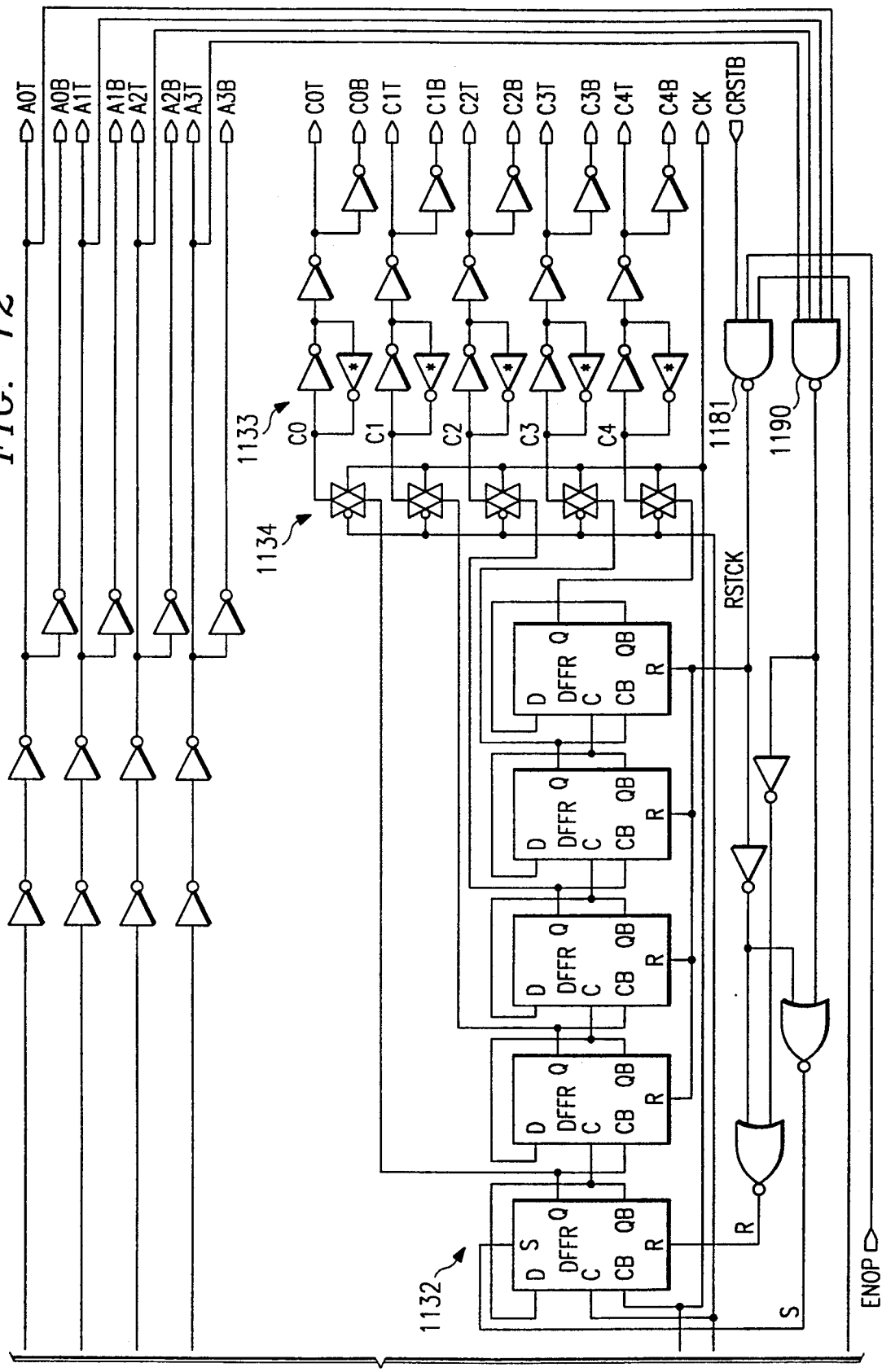

FIG. 12 is a schematic diagram of subblock WR_PROT_DEC which during a write command from microprocessor 202 (WEIBINT and CEIBINT both low) uses the four bits A0-A3 on address bus 212 to check the contents of the corresponding one of the 16 cells of partition register 1136. Each of the 16 NAND gates 1201-1216 connects to one of the 16 possible 4-bit combinations of the four address bits and their complements plus connects to a NOR of the corresponding cell of partition register 1136 with CEIBINT and WEIBINT. Thus for each possible A0-A3 precisely one of the 16 NAND gates 1201-1216 has four high inputs from the address lines, and if corresponding cell of partition register 1136 contains a 0 (so the corresponding block of RAM 204 is not write protected), then the NOR gate input to this NAND gate is also high (when CEIBINT and WEIBINT are low) and the NAND gate outputs a low to the connected one of NAND gates 1221-1224 which in turn outputs a high to NOR gate 1225 to drive it low. (Conversely, if the corresponding cell of partition register 1136 contains a 1 to indicate write protection, then each of NAND gates 1201-1216 is high due to at least one low input, and this implies NOR gate 1225 is high.) As described in the next paragraph, latch 1230 suppresses spurious output at node WE_DEC_B that might arise from short (less than 10 ns) highs in WEIBINT deriving from WEIB from microprocessor 202. Thus with latch 1230 outputting a low to NOR gate 1227, NOR gate 1225 low (for an address that is not write protected) implies WE_DEC_B is high which permits the write enable signal WE\ low from microprocessor 202 to propagate to RAM 204 by making a transmission gate in buffer WE_BUF conducting to connect input terminal WEIB to output terminal WEOB. Conversely, NOR gate 1225 high (for an address that is write protected or for WE\ or CE \ high from microprocessor 202) implies WE_DEC_B is low which makes the transmission gate in buffer WE_BUF nonconducting and isolates output terminal WEOB from input terminal WEIB and prevents the write enable signal WE\low from microprocessor 202 from activating RAM 204.

Latch 1230 operates to suppress spurious low pulses of WE\ from microprocessor 202 from propagating to RAM 204 as follows. CEIBINT and WEIBINT feed NOR gate 1231 and, together with the inversion of NOR gate 1225, feed NOR gate 1232, so when CEIBINT and/or WEIBINT is high (as prior to a write command), then NOR gates 1231 and 1232 are both low and latch 1230 outputs a high to NOR gate 1227. This high input to NOR gate 1227 stops NOR gate 1225 from controlling node WE_DEC_B and holds the node low (so the output WEOB to RAM 204 is high or tristated and no writing occur). CEIBINT and/or WEIBINT high also implies that all of the NAND gates 1201-1216 are high due to the low inputs from the NOR gates; thus NOR gate 1225 is high and leads to a low input to NOR gate 1232. Now when CEIBINT and WEIBINT switch so that both are low (as for a write command from microprocessor 202), there are two cases to consider: first, if the address bits A0-A3 are for a write protected address, and second, if the address bits are for a write permitted address. In the first case (A0-A3 for an address that is write protected) when WEIBINT and CEIBINT both go low NOR gate 1225 remains high and all inputs to NOR gates 1231-1232 are low so both NOR gates switch high to drive latch 1230 low to release NOR gate 1227 to follow NOR gate 1225. But the address bits have kept NOR gate 1225 high, so WE_DEC_B remains low.

The second case with the address bits on A0-A3 for an address that is write permitted proceeds as in the first case except that about 18-20 ns after NOR gate 1232 has gone high the low going edge of WEIBINT and CEIBINT has rippled through the NAND gates 1201-1216 and 1221-1224 to drive NOR gate 1225 low which, in turn, drives node WE_DEC_B high and NOR gate 1232 low. Note that NOR gate 1232 going low does not affect the state of latch 1230 which permits NOR gate 1225 to control node WE_DEC_B.

Now if WEIBINT were low for only a short time (less than 10 ns) and returned high (i.e., a glitch from microprocessor 202) when the address on A0-A3 is not a write protected address, then the delay for the low going edge of WEIBINT to ripple through the NAND gates 1201-1216 and 1221-1224 is greater than the WEIBINT low pulse duration, and WEIBINT returns high to drive NOR gate 1231 low to set latch 1230 high and force NOR gate 1227 low before NOR gate 1225 switches low. Thus node WE_DEC_B remains high and the low WE pulse does not propagate to RAM 204.

Figure 13:
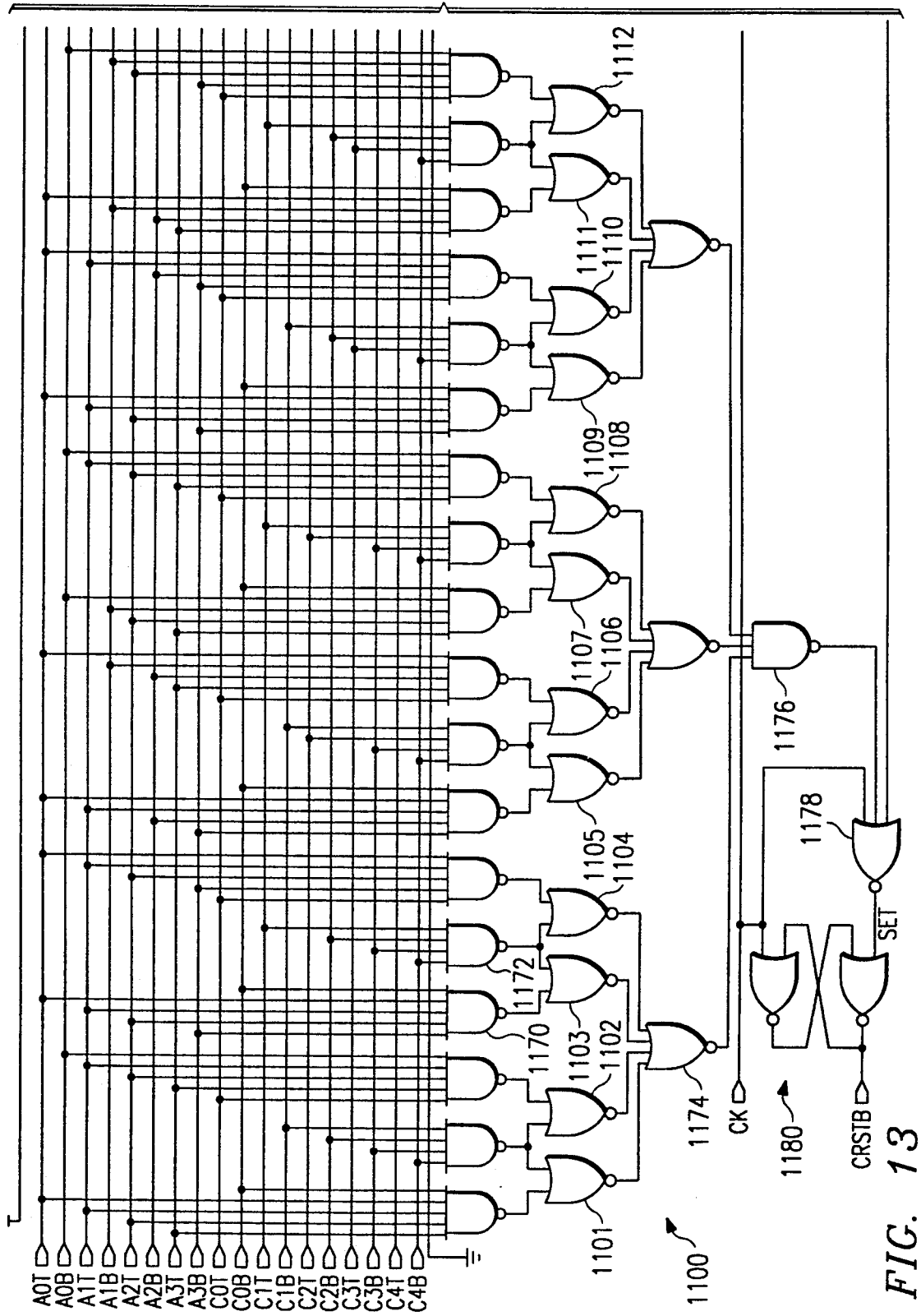

A low input at terminal DISB disables the write protection of RAM 204 as follows. Block DIS_IN passes the signal at terminal DISB to the input DISB at block PIN_DIS; if there is a power failure (PFB goes low), then DIS_IN latches the signal at DISB for output to PIN_DIS. FIG. 13 shows block PIN-DIS which includes NAND gates 1310 and 1314 plus inverter 1312 that feed a low at input node DISB to a high at output node DISWE_ADD. A high at DISWE_ADD leads to high inputs at node DISWE_ADD of block WR_PROT and at node DISABLE of buffer WEI_IN. The high at DISWE_ADD of WR_PROT forces all four to the lines AB(3:0) low (see FIG. 11a) which corresponds to an address with A0-A3 all 1's. This prevents floating inputs from drawing current.

The high DISWE_ADD to input node DISABLE of buffer WEI_IN stops write enable signals from microprocessor 202 incoming at terminal WEIB from passing out at output node WEIBINT but rather forces node WEIBINT high. Thus in WR_PROT_DEC all of the NOR gates feeding NAND gates 1201-1216 are low and hence all of the NAND gates are high, so NOR gate 1225 is high and output node WE_DEC_B is low which tristates output WEOB to RAM 204.

Figure 14:
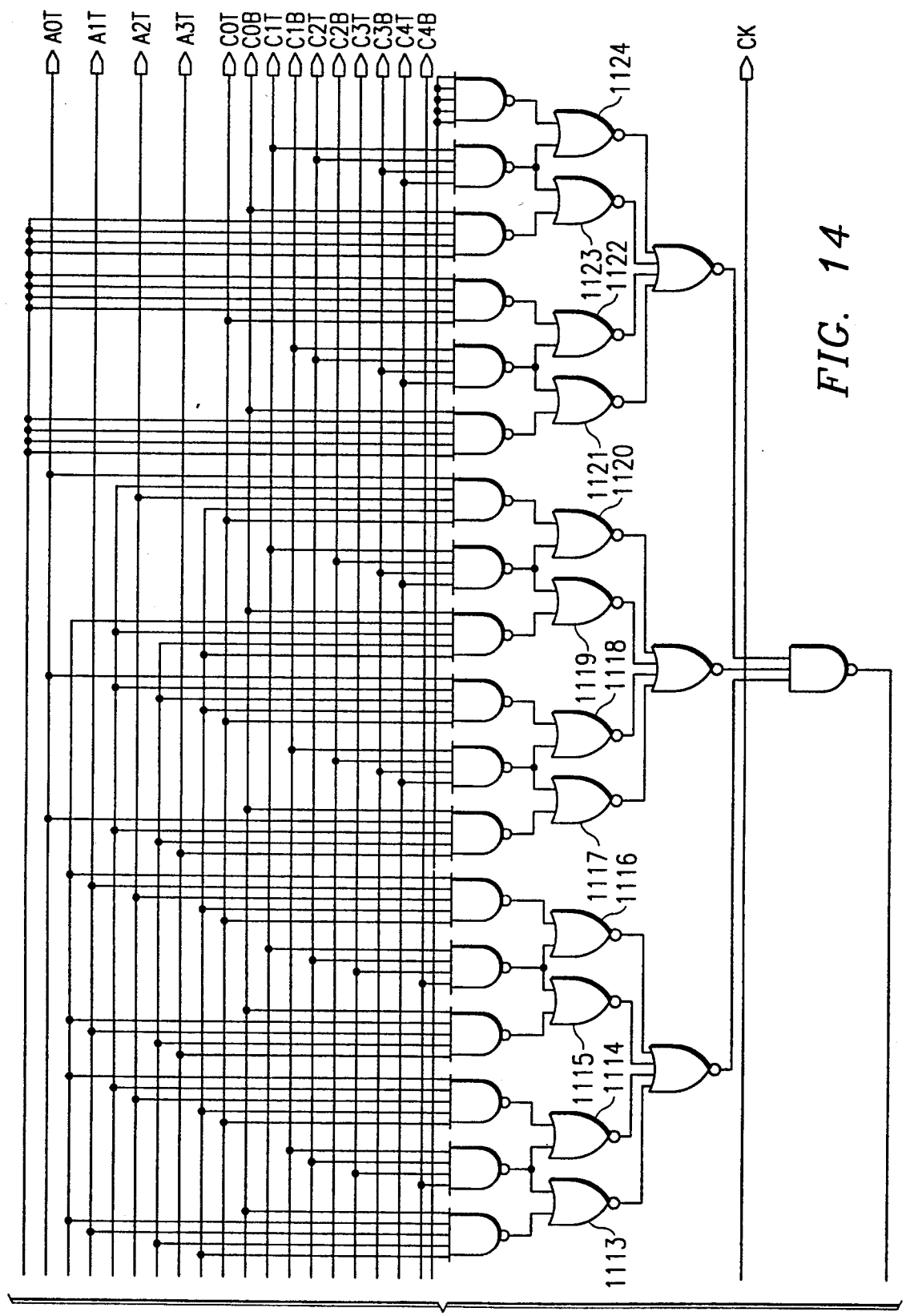
Figure 15:
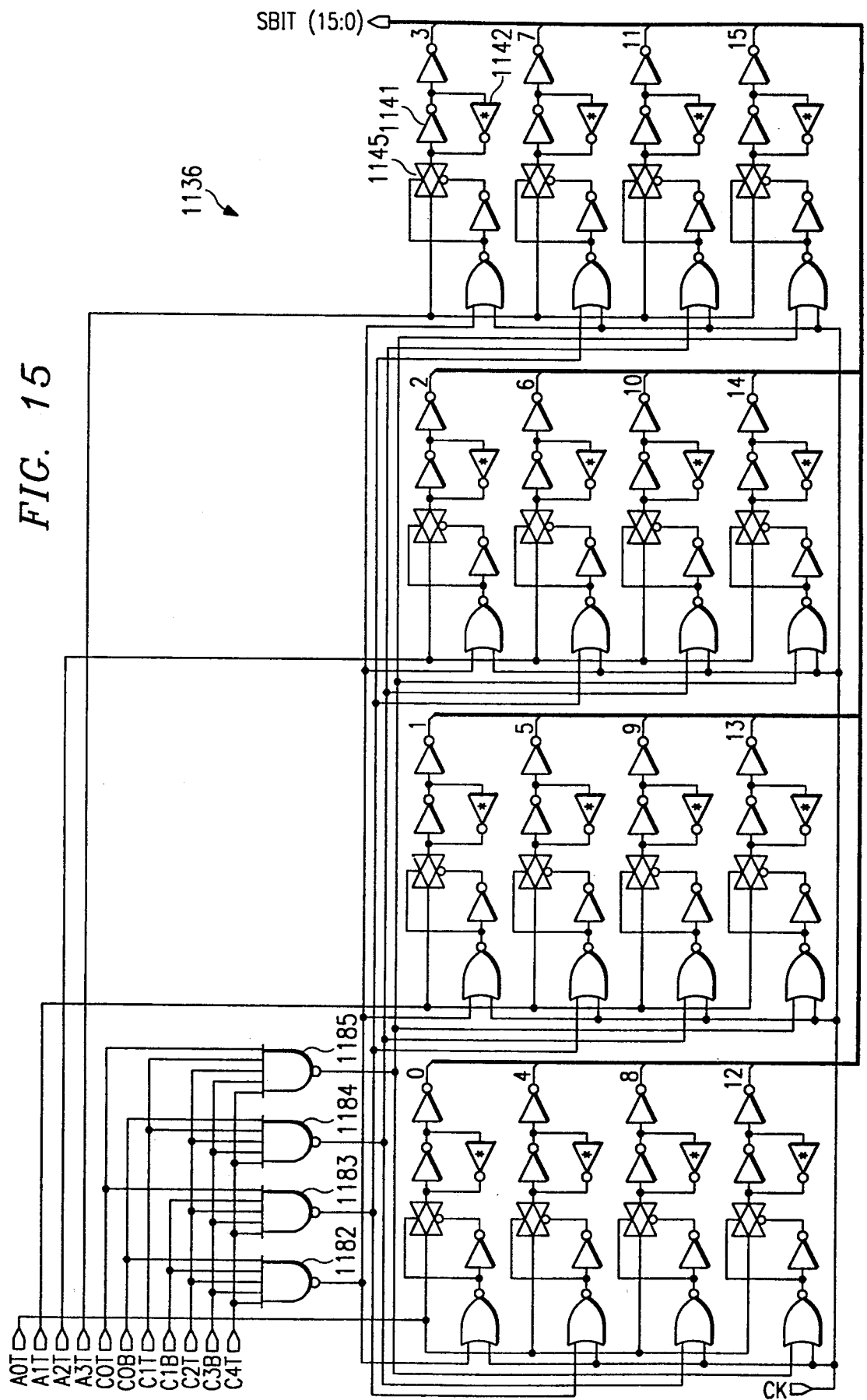
Figure 16:
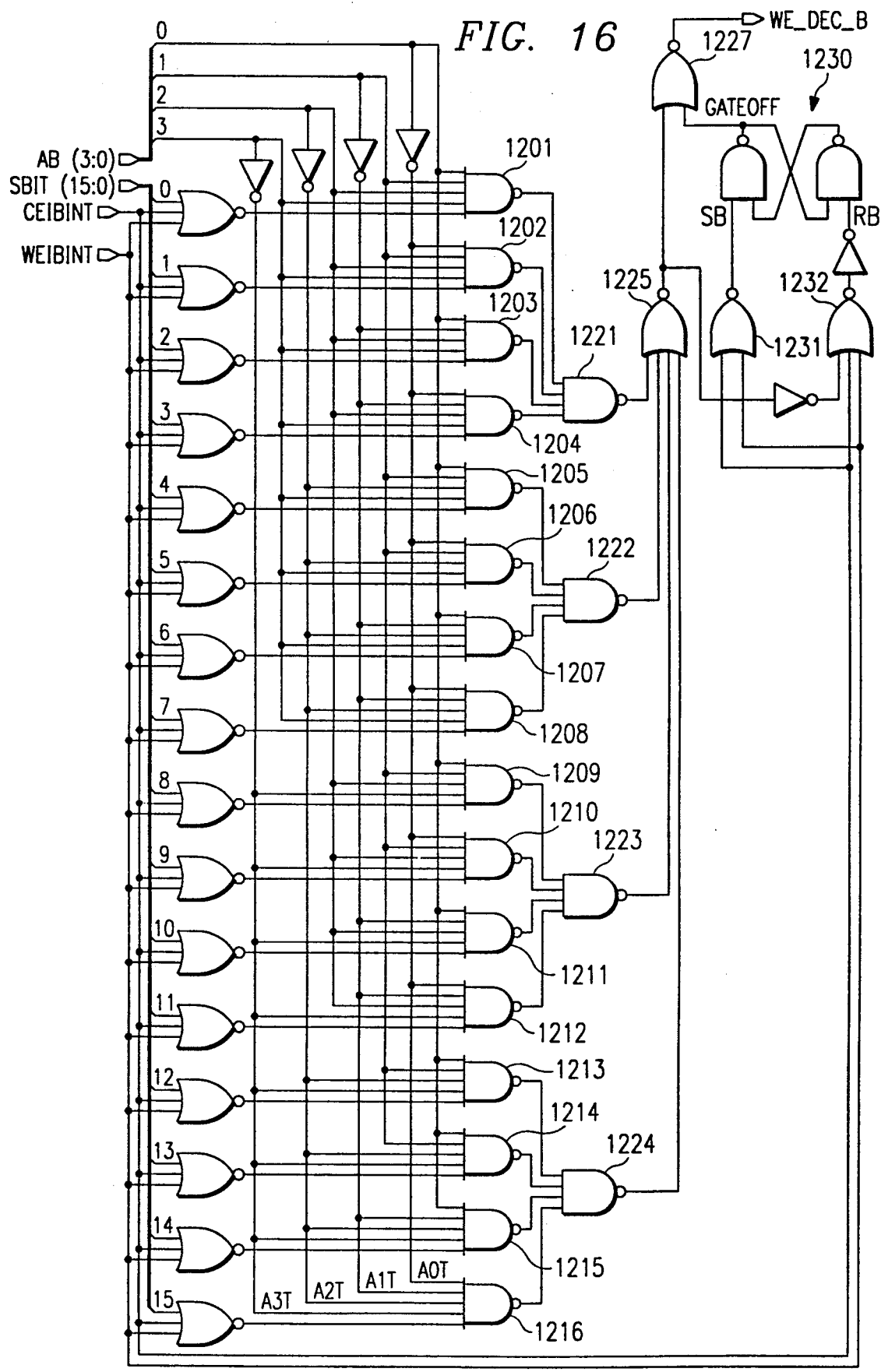
Figure 17:
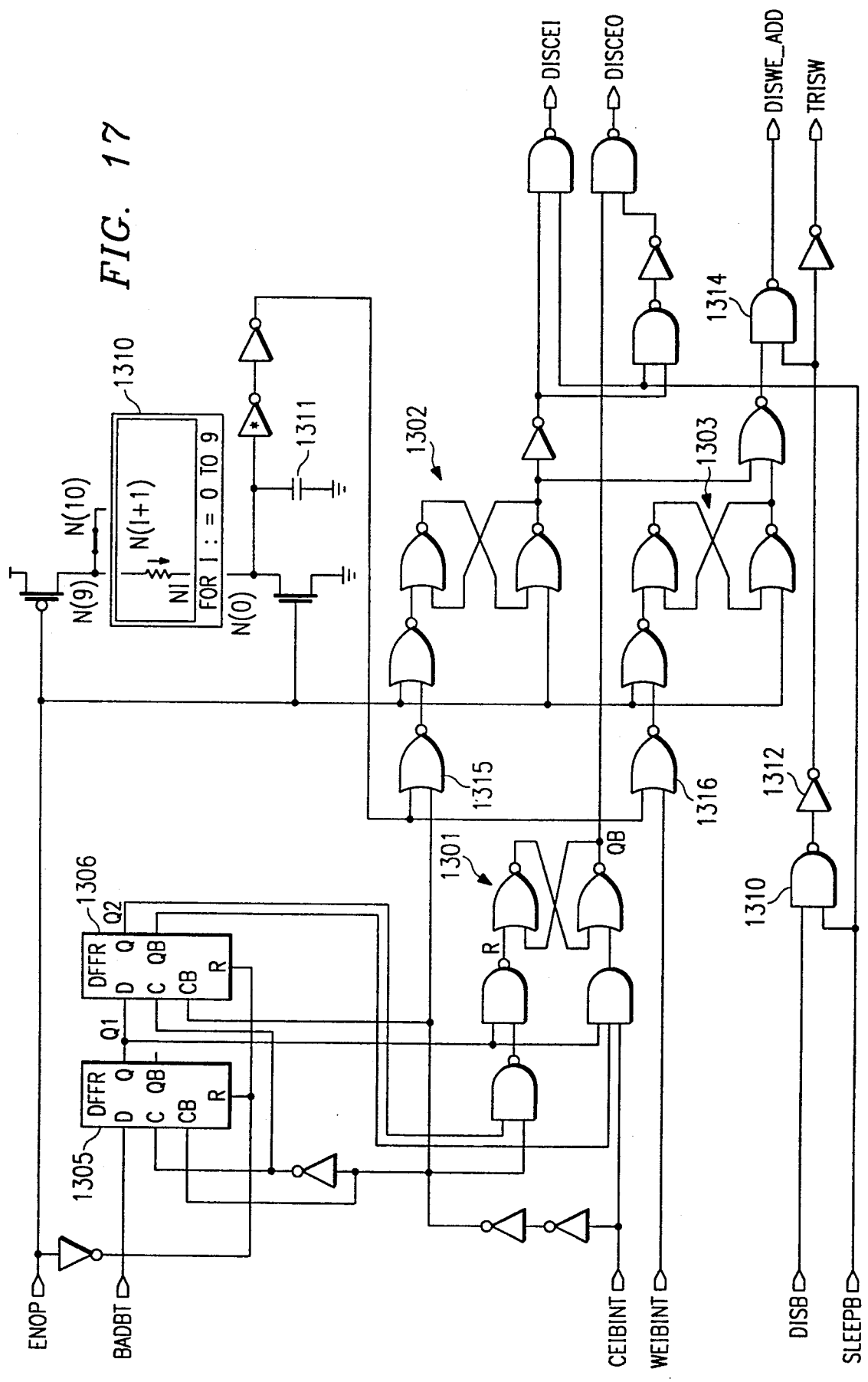
Figure 18:
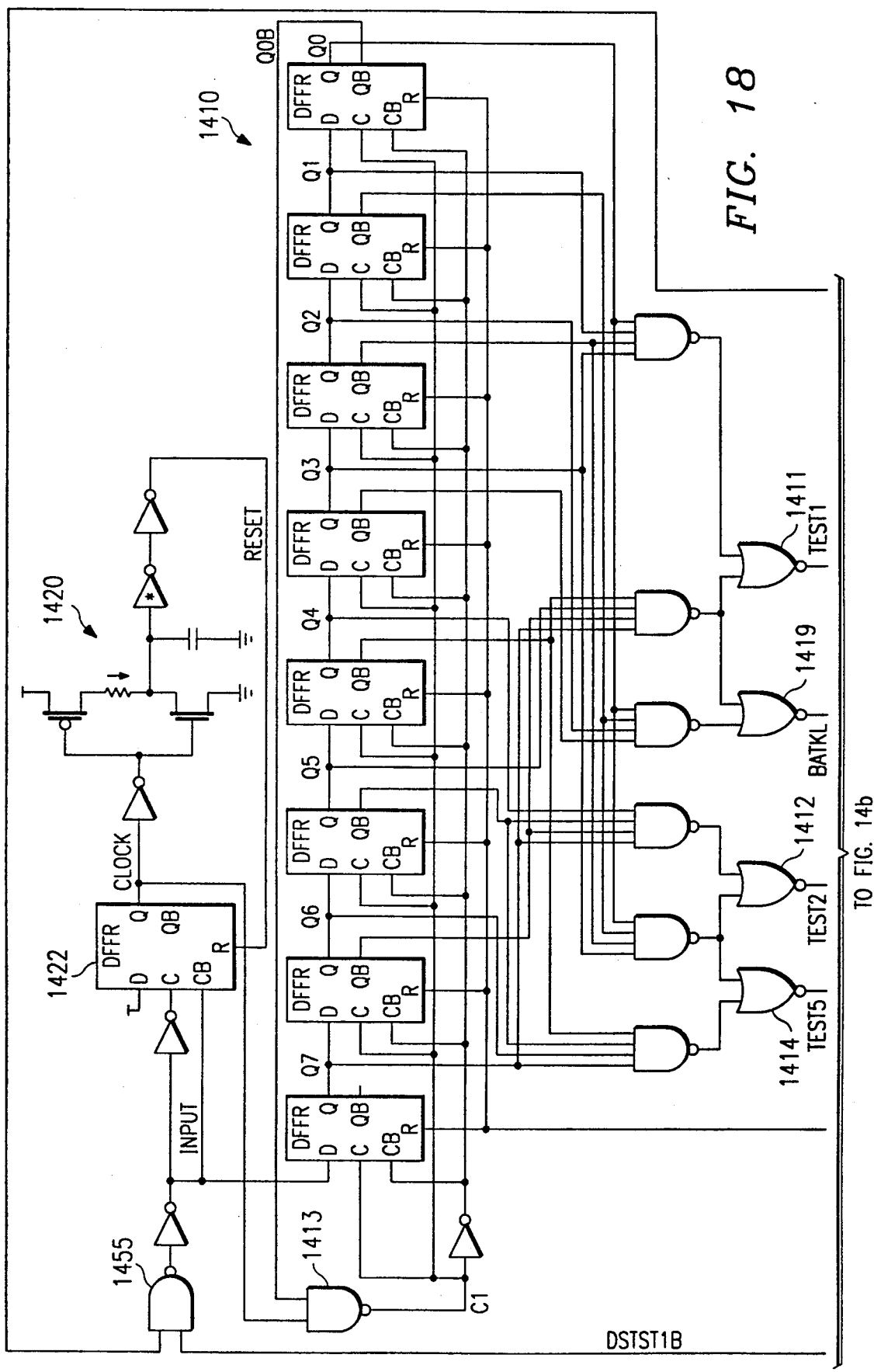
Figure 19:
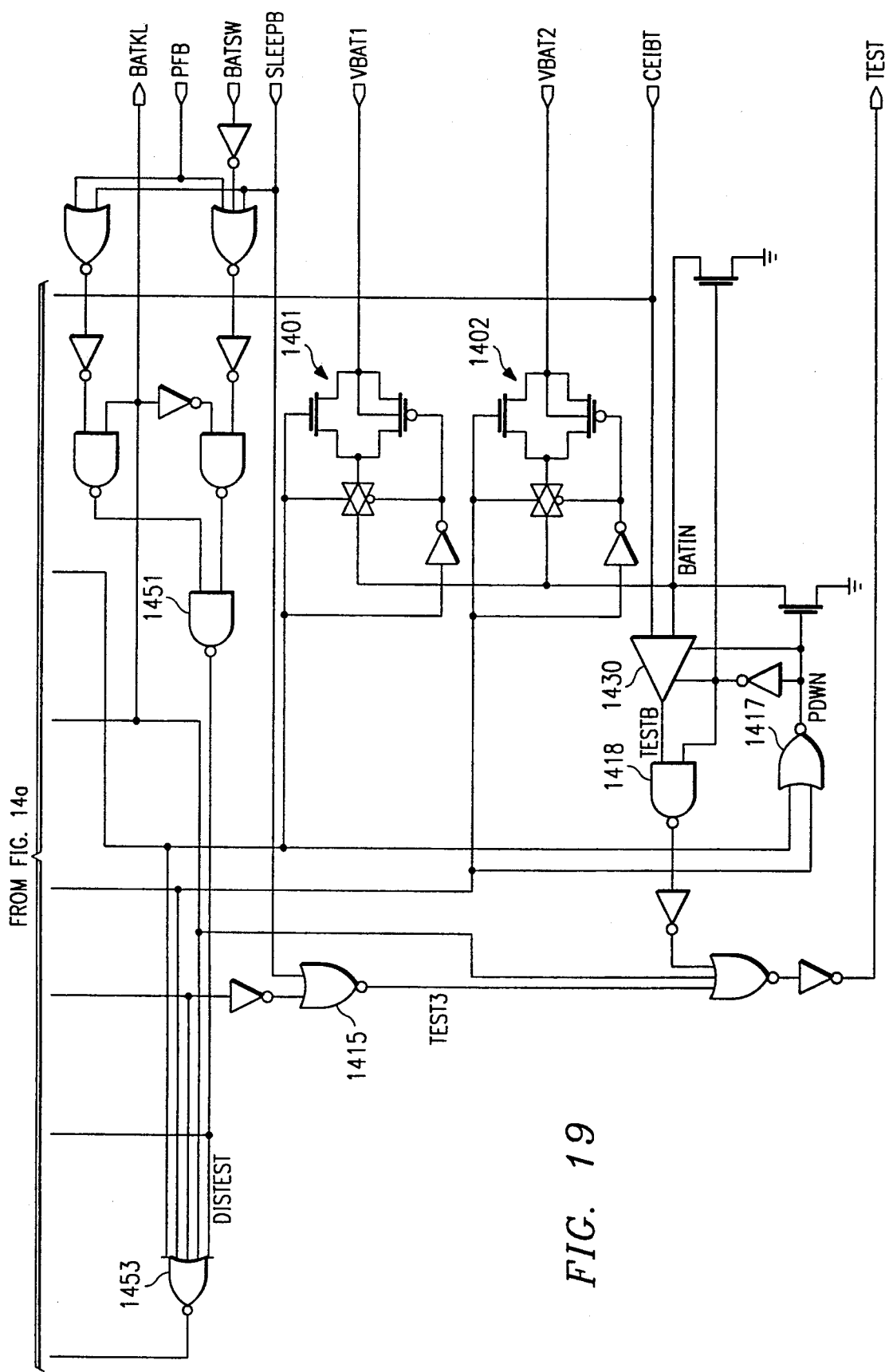

Block PIN_DIS also contains circuitry for generating the DISCEI and DISCEO signals which, when high, disable the CEIB and CEOB signals in that CEIBINT no longer follows CEIB but is driven high and CEOB no longer follows CEIB but is isolated. PIN_DIS includes latches 1301-1303, flip-flops 1305-1306, and delay resistor 1310 and capacitor 1311 which operates as follows. If ENOP is high (e.g., VCCI supplying the power for controller 100), then capacitor 1311 is discharged, latches 1302 and 1303 are in states outputting lows, and if SLEEPB is high, then output node DISCEI FIG. 14 shows block OWTEST which provides for testing of the voltage at battery terminals VBAT1 and VBAT2 when controller 100 is in sleep mode and VCCI is set between PFB and BATSW (both low). Terminal CEIB is used as both a 1-bit port for a serial data protocol to load register 1410 with a test command and as input of a test voltage; inverter 1420 which includes a capacitor and resistor for an RC time delay of about 650 nanoseconds feeds the reset flip-flop 1422 to generate a clock signal to clock register to load data input at node CEIBT through buffer CEI_IN from input terminal CEIB. Note that the first bit (lowest order) loaded into register 1410 is always a 1 so when it has propagated through to the last flip-flop, the flip-flop Q0B output is low and drives NAND gate 1413 high to stop the clocking of register 1410. As a command example, register contents (Q7Q6 . . . Q1Q0) equal to 10101011 makes the two NAND gates feeding NOR gate 1411 are both low, so NOR gate 1411 is high and this makes transmission gate pair 1401 conducting and connects VBAT1 to the positive input of comparator 1430. The negative input of comparator 1430 connects to CEIBT, so by varying the voltage on CEIBT (which connects directly through an ESD suppression resistor to terminal CEIB) the voltage of the battery connected to VBAT1 can be determined. In particular, NOR gate 1411 high drives NOR gate 1417 which provides a high to NAND gate 1418; the other input to NAND gate 1418 is the output of comparator 1430 which will be high if and only if the voltage at VBAT1 is higher than the voltage at CEIBT. Thus NAND gate 1418 outputs a low if and only if VBAT1's voltage exceeds CEIBT's voltage, and this translates to a high at TEST which pulls down node CEIB in buffer CEI_IN. For example, if VBAT1 were at 3.0 volts and a voltage of 3.1 volts were applied at CEIB after loading register 1410 with 10101011, then comparator 1430 would output a low and TEST would be low; now if 2.9 volts were applied at CEIB, then comparator 1430 and TEST would both switch high and TEST high would pull down CEIB so that the comparison result could be sensed.

Similarly, register 1410 contents equal to 10011001 drives NOR gate 1412 high to connect VBAT2 to comparator 1430 to test the battery connected to VBAT2. Register 1410 contents equal to 11001001 makes NOR gate 1414 high and thus NOR gate 1415 high if and only if SLEEPB is low, and NOR gate 1415 high drives TEST high to provide a test of SLEEPB. Lastly, register 1410 contents equal to 10100101 forces NOR gate 1419 high to make BATKL high and discharge the batteries as discussed in connection with FIG. 4. Note that either PFB or SLEEPB high (usual operation) will make NAND gate 1451 high, NOR gate 1453 low, and NAND gate 1455 high to prevent voltage variations at CEIBT from clocking flip-flop 1422 and loading register 1410. Thus loading register 1410 requires sleep mode, although once register 1410 has contents equal to one of the foregoing four commands the corresponding NOR gate (1411, 1412, 1414, or 1419) high will make NOR gate 1453 low and NAND gate 1455 high to prevent further register 1410 access. Note that first driving VCCI to 7.76 volts and then down to 4 volts will set SLEEP=0 and PFB=0 so that register 1410 can be loaded with contents 10100101 to drive BATKL high, and BATKL high will discharge batteries at nodes BAT1 and BAT2 while controller 100 is powered by VCCI at 4 volts. This permits full discharge of batteries for proper disposal.

Controller 100 may be fabricated with CMOS processing of silicon. The gate dimensions can be varied over a wide range, various CMOS processes such as metal, polysilicon or polycide gate, n-well, twin well, silicon-on-insulator, double level metal, and so forth could be used.

FURTHER MODIFICATIONS AND VARIATIONS

The preferred embodiments may be modified in many ways while retaining one of more of the features of a controlled-memory block write protection, p-channel FET switching of batteries, supervoltage power input for setting sleep mode, and battery discharge. For example, the number of address bits decoded to define the write protected blocks could be increased or decreased and more than one set of address bits may be decoded to the same protection bit, the sequence of reads to program the protection bits may be varied or a special programming input may be added, multiple input power supplies in parallel could be controlled with a multiple input decoder in place of the latch driven by the p-channel FETs; the battery discharge signal could be a special direct input rather than a command to be loaded.

What is claimed is:

1. A memory controller, comprising:
   (a) at least one address input node, said address input node(s) capable of inputting an address, said address having a set of write protected addresses and a set of stored data;
   (b) a memory write input node;
   (c) a memory write output node;
   (d) at least one programmable element with first and second states, said programmable element(s) corresponding to said set of write protected addresses; and
   (e) switch circuitry connected to said address input node(s), said memory write input node, said memory write output node, and said programmable element(s), said switch circuitry isolating said memory write output node from said memory write input node when said programmable element is in said first state and said address at said address input node(s) is in said set of write protected addresses, but said switch circuitry coupling said memory write output node to said memory write input node when said programmable element is in said second state and said address at said address input node(s) is in said set of write protected addresses.

2. The memory controller of claim 1, wherein:
   (a) said programmable element(s) may be programmed by applying a specific sequence of signals at said address input node(s) and said memory write input node.

3. The memory controller of claim 1, wherein:
   (a) addresses have N number of bits;
   (b) said at least one address input node is K number of address input nodes
   (c) said at least one programmable element is $2^K$ number of elements; and
   (d) said corresponding sets of write protected addresses are blocks of addresses of size $2^{N-K}$.

4. The memory controller of claim 3, wherein:
   (a) said $2^K$ number of programmable elements may be programmed by applying a specific sequence of signals at said address input node(s) and a chip enable node.

5. The memory controller of claim 1, further comprising:
   (a) a primary power input node with a voltage level at a first magnitude;
   (b) a backup power input node with a voltage level at a second magnitude;
   (c) a power output node;
   (d) write prevention circuitry coupled to said primary power input node, and said write prevention circuitry isolating said memory write output node from said memory write input node when said first magnitude of the voltage level of said primary power input node decreases below a first level; and
   (e) backup circuitry coupled to said backup power input node, said primary power input node, and said power output node, said backup circuitry connecting said backup power input node to said power output node when said first magnitude of said voltage level at said primary power input node decreases to below said second magnitude of said voltage level at said backup power input node.

6. The memory controller of claim 5, wherein said first level is defined to be outside an approximate range of 4.5 volts to 6 volts or an approximate range of 4.75 volts to 6 volts and said first magnitude of said voltage level at said primary power input node is within an approximate range of 4.5 volts to 6 volts or within an approximate of 4.75 volts to 6 volts and said second magnitude of said voltage level at said backup power input node is within an approximate range of 2 volts to 4 volts.

7. The memory controller of claim 1, wherein a user controls which of said programmable element(s) are programmed.

8. An integrated circuit, comprising:
   (a) a first input node;
   (b) a second input node;
   (c) a switch selectively coupling one of said first and second nodes to a third node;
   (d) a first p-channel FET with source coupled to said first input node and gate coupled to said third node;
   (e) a second p-channel FET with source coupled to said second input node and gate coupled to said third node; and
   (f) circuitry connected to the drains of said first and second FETs to activate said switch if either of said FETs is turned on.

9. The integrated circuit of claim 8, wherein:
   (a) said circuitry includes (i) a first impedance connected between said drain of said first FET and a reference node, (ii) a second impedance connected between said drain of said second FET and said reference node, and (iii) a latch with a first input coupled to said drain of said first FET and a second input coupled to said drain of said second FET, and with an output coupled to activate said switch; and
   (b) said switch includes (i) a third FET coupled between said first input node and said third node and (ii) a fourth FET coupled between said second input node and said third node.

10. An integrated circuit, comprising:
    (a) a power supply node capable of providing power;
    (b) a backup power node capable of providing power;
    (c) circuitry powered by power from either said power supply node or said backup power node, said power selected in accordance with the voltage level at said power supply node compared to the voltage level at said backup power node; and
    (d) a programmable element that is programmed to a first state when the voltage level at said power supply node exceeds a first voltage level, wherein said circuitry operates (i) in a first mode if powered by power selected from said power supply node, (ii) in a second mode different from said first mode if powered by power selected from said backup power node and said programmable element is in said first state, and (iii) in a third mode different from said first and second modes if powered by power from said backup power node and said programmable element is not in said first state.

11. An integrated circuit, comprising:
    (a) a power supply node;
    (b) a battery power node;
    (c) a reference voltage node;
    (d) means for connecting said reference voltage node and selectively to either said power supply node or said battery power node; and
    (e) a switch selectively coupling said battery power node to said reference node when said means for connecting said reference voltage node and selectively to either said power supply node or said battery power node is connected to said power supply node, said switch connected to a discharge node;
    (f) wherein a signal at said discharge node controls said switch.

12. The integrated circuit of claim 11, further comprising:
    (a) a second battery power node; and
    (b) a second switch coupling said second battery power node to said reference voltage node when said means for connecting said reference voltage node and selectively to either said power supply node or said battery power node is connected to said power supply node, said second switch connected to said discharge node;
    (c) wherein said signal at said discharge node controls said second switch.

13. The integrated circuit of claim 11, further comprising:
    (a) at least one programmable element coupled to said discharge node, wherein said programmable element provides said signal at said discharge node.

* * * * *